US006472682B1

(12) United States Patent
Kuramoto

(10) Patent No.: US 6,472,682 B1
(45) Date of Patent: Oct. 29, 2002

(54) OPTICAL MODULATOR, SEMICONDUCTOR LASER DEVICE EQUIPPED WITH AN OPTICAL MODULATOR, AND OPTICAL COMMUNICATION SYSTEM

(75) Inventor: Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 25 days.

(21) Appl. No.: 09/695,856

(22) Filed: Oct. 26, 2000

(30) Foreign Application Priority Data

Mar. 30, 2000  (JP) .......................... 2000-092860

(51) Int. Cl.[7] .......................... H01L 29/06; G02B 6/12; H01S 5/00; G02F 1/01
(52) U.S. Cl. .......................... 257/14; 257/15; 257/189; 257/622; 257/623; 385/2; 385/14; 385/131; 372/43; 372/68; 372/75; 359/240; 359/248
(58) Field of Search .......................... 385/2, 14, 131; 257/14, 189, 622, 623, 15; 372/7, 11, 43, 45, 48, 68, 75; 359/240, 248

(56) References Cited

U.S. PATENT DOCUMENTS

| 5,012,302 A | * | 4/1991 | Goronkin ...................... 257/15 |
| 5,128,728 A | * | 7/1992 | Liu .............................. 257/103 |
| 5,289,486 A | * | 2/1994 | Iga et al. ....................... 257/15 |
| 5,386,126 A | * | 1/1995 | Henderson et al. ............ 257/14 |
| 5,416,338 A | * | 5/1995 | Suzuki et al. ................. 257/21 |
| 5,530,580 A | * | 6/1996 | Thompson et al. .......... 359/248 |
| 5,671,242 A | * | 9/1997 | Takiguchi et al. ............. 257/18 |
| 5,747,827 A | * | 5/1998 | Duggan et al. ................ 257/12 |
| 5,825,525 A | * | 10/1998 | Harwit ........................ 359/248 |
| 5,882,951 A | * | 3/1999 | Bhat .................... 148/DIG. 50 |
| 6,088,500 A | * | 7/2000 | Zmudzinski et al. ........ 359/248 |

OTHER PUBLICATIONS

"29a–SZL–24 Asymmetric Triple Coupled Quantum Well for Blue–Chirp MQW–EA Modulators"; Proceedings of the 45th Joint Symposium on Applied Physics and Related Sciences, Tokyo University of Technology, Mar. 1998.*

* cited by examiner

Primary Examiner—Evelyn A Lester
(74) Attorney, Agent, or Firm—Leydig, Voit & Mayer, Ltd.

(57) ABSTRACT

An optical modulator and a semiconductor laser device including the optical modulator, both reducing variations in the refractive index of an optical modulator or making variations negative without an increase in loss or a decrease in extinction ratio, as well as an optical communications system increasing an interval of distance at which modulated light is transmitted, by use of the optical modulator and the semiconductor laser device including the optical modulator. The optical modulator includes a semiconductor substrate of a first conductivity type; a light absorption layer on the semiconductor substrate and having a multiple quantum well structure, the multiple quantum well structure including a first well layer and second well layers. The peak wavelength of the absorption spectrum of the second well layers is shorter than the peak wavelength of the absorption spectrum of the first well layers A semiconductor cladding layer of the second conductivity type is on the light absorption layer.

12 Claims, 23 Drawing Sheets

Eg2 < Eg1

US 6,472,682 B1

OPTICAL MODULATOR, SEMICONDUCTOR LASER DEVICE EQUIPPED WITH AN OPTICAL MODULATOR, AND OPTICAL COMMUNICATION SYSTEM

BACKGROUND OF THE INVENTION

1. Field of the Invention

The present invention relates to an optical modulator, a semiconductor laser device equipped with an optical modulator, and an optical communications system, and more particularly, to an optical modulator involving little distortion in the waveform of a signal after transmission thereof, a semiconductor laser device equipped with the optical modulator, and an optical communications system for transmitting an optical signal over a long distance through use of the semiconductor laser device.

2. Background Art

An improvement in the performance of a semiconductor laser and an improvement in the yield of a semiconductor laser required for inexpensively manufacturing a semiconductor laser are important in realizing widespread proliferation of a public communication network that uses an optical fiber.

High-speed modulation of a laser beam for coping with an increase in the volume of information transmitted is particularly indispensable for improving the performance of a semiconductor laser. In order to enable long-distance transmission of an optical signal while limiting variation in wavelength, which arises at the time of modulation, an external modulation system is adopted for modulating a laser beam at high speed. In this system, light emitted from a semiconductor laser usually has a predetermined intensity and is passed through an optical modulator capable of inducing and interrupting transmission of light, to thereby modulate the light.

An electroabsorption modulator (EAM) is used as an optical modulator for use with the external modulation system. EAMs can be roughly divided into two types: that is, an FAM using a single thick light-absorption layer, and an EAM employing a multiple quantum well (MQW) structure formed by means of stacking thin quantum well layers, each quantum well layer being capable of forming excitons at room temperature. The former type of EAM effects extinction by utilization of variation in an absorption spectrum due to the Franz-Keldysh effect, and the latter type of EAM effects extinction by utilization of variation in absorption spectrum due to the Stark effect.

In an optical modulator, absorption of a laser beam is changed in accordance with a voltage applied to the optical modulator. For this reason, when a modulation signal voltage is applied to a high-frequency electric circuit connected to an optical modulator, a laser beam emitted from an exit end face of an optical modulator is subjected to intensity modulation in accordance with the modulation signal voltage.

In a case where a light absorption layer of an optical modulator is constituted of an MQW structure, a high extinction ratio (the ratio between the amount of light transmitted during an ON operation of the optical modulator and the amount of light transmitted during an OFF operation of the optical modulator) is attained. Therefore, a light absorption layer having an MQW structure is usually used for high-speed transmission.

FIG. 27 is a cross-sectional view showing a conventional optical modulator. In FIG. 27, reference numeral 1 designates an n-type InP substrate (hereinafter an n-type is depicted as "n-," and a p-type is depicted as "p-"); 2 designates an n-type optical confinement layer formed of n-InGaAsP; 3 designates a light absorption layer formed of InGaAsP; 4 designates a p-type optical confinement layer formed of p-InGaAsP; 5 designates an Fe-doped InP embedded layer; 6 designates an n-InP embedded layer; 7 designates a p-type cladding layer formed of p-InGaAsP; 8 designates a p-InGaAs contact layer; 9 designates a $SiO_2$ dielectric film; 10 designates a Ti/Au surface electrode; 11 designates an Au surface-plating layer; 12 designates an Au/Ge/Ti/Pt/Ti/Pt/Au underside electrode; 13 designates an underside plating layer; and 14 designates an optical modulator (EAM).

FIG. 28 is a cross-sectional view showing the light absorption layer 3 of conventional type. In FIG. 28, reference numeral 3a designates a quantum well layer (hereinafter referred to simply as a "well layer"), and 3b designates a barrier layer. In the MQW structure of the light absorption layer 3, all ten well layers 3a are of equal thickness, and all nine barrier layers 3b are of equal thickness.

FIG. 29 is an energy diagram of the light absorption layer 3. In FIG. 29, reference symbol Ec denotes the conduction band; and Ev denotes the valence band.

FIG. 30 is a graph showing an absorption spectrum of the optical modulator 14.

In order to achieve efficient extinction by making changes in the absorption spectrum of each of the well layers 3a of the conventional light absorption layer 3 having an MQW structure, usually all the well layers 3a are made equal in band-gap wavelength and thickness. An absorption spectrum 'A' shown in FIG. 30 represents a typical absorption spectrum of the optical modulator (EAM) 14 equipped with the light absorption layer 3 having an MQW structure.

If an electric field is applied to the MQW structure by application of a bias voltage to the optical modulator 14, the absorption spectrum 'A' is changed to an absorption spectrum 'B'. In a case where the wavelength of laser incident light is set to $\lambda_0$, the absorption coefficient a relative to the incident light is changed by the bias voltage. The absorption coefficient α at the wavelength $\lambda_0$ of the incident light is changed by application of a bias voltage, to thereby turn laser light on and off. The optical modulator (EAM) 14 operates on the basis of the principle mentioned above.

Eq. (1) of the Kramers-Kronig relation applies to the amount of changes in an absorption spectrum (Δα) in response to a change in the bias voltage and the amount of changes in refractive index (Δn).

$$\Delta n(\lambda_0) = \frac{\lambda_0^2}{2\pi^2} \lim_{\varepsilon \to 0} \left( \int_0^{\lambda_0 - \varepsilon} + \int_{\lambda_0 + \varepsilon}^{\infty} \right) \frac{\Delta \alpha}{\lambda_0^2 - \lambda^2} d\lambda \quad (1)$$

During the course of an optical modulation operation, the refractive index of the optical modulator is changed in accordance with variations in the absorption spectrum of the light absorption layer 3 of the optical modulator 14. Eventually, the wavelength of the light emitted from the optical modulator 14 is changed. In other words, a chirping phenomenon arises.

FIGS. 31A and 31B are graphs showing the relationship between chronological change in light intensity and a chirping phenomenon.

By reference to FIGS. 31A and 31B, the relationship will now be described. When optical modulation of an optical signal is actually performed, the voltage applied to the optical modulator 14 assumes a value of 0V at a point at which light of the highest intensity is transmitted (i.e., a point indicated by P0 in FIG. 31A). The voltage applied to the optical modulator 14 assumes a voltage of about −1V even at a point at which sufficiently low intensity of light is transmitted (i.e., a point indicated by P1 in FIG. 31A). Within the range between the point P0 and the point P1, an α parameter usually assumes a positive value; that is, variation in the refractive index of an optical modulator assumes a positive value. When the intensity of light is increased, as shown in FIG. 31A, a negative variation arises in the wavelength of incident laser light, as shown in FIG. 31B. In contrast, when the intensity of light is decreased as shown in FIG. 31A, a positive variation arises in the wavelength of laser incident light, as shown in FIG. 31B. Such a positive variation in wavelength is called a positive "chirp" phenomenon.

An optical fiber; which serves as a transmission line, has a wavelength dispersive characteristic such that the group velocity of light differs according to wavelength. For this reason, if a positive chirp phenomenon arises, the waveform of light is deteriorated after transmission thereof, because of the wavelength dispersive characteristic of the optical fiber. As a result, the waveform of received optical data is greatly impaired. In order to improve the reliability of received data, the deterioration in waveform of the received data must be compensated by repetition of transmission/receipt of an optical signal at a short interval of distance. Thus, an optical communications system inevitably becomes expensive.

As the α parameter assumes a greater positive value; that is, as a variation in the refractive index of the optical modulator assumes a greater positive value, the deterioration in waveform of an optical signal after transmission thereof becomes greater. For this reason, in addition to application of a modulation voltage, there is employed a method of applying a negative DC bias voltage to the optical modulator 14, in advance, in order to use the optical modulator 13 within the range where the α parameter assumes a small value. However, the method encounters problems; for example, a modulated waveform being deteriorated for reasons of an increase in the loss of absorption of the optical modulator 14 or an increase in the ratio of change in absorption coefficient; and an extinction ratio dropping because of significant collapse of excitons induced by a strong electric field. Therefore, practical use of an optical modulator within a range where the α parameter is sufficiently small is considerably difficult.

The present invention has been conceived to solve the drawbacks of the background art set forth.

The object of the present invention is to provide an optical modulator and a semiconductor laser device having the optical modulator, both reducing variations in the refractive index of an optical modulator or making variations negative without involvement of an increase in loss or a decrease in extinction ratio. The present invention further provides an optical communications system capable of increasing an interval of distance at which modulated light is transmitted, by use of the optical modulator and the semiconductor laser device having an optical modulator.

For reference, Japanese Patent Application Laid-Open No.231272/1999 describes an optical modulator having a pin structure for enabling optical transmission of an optical signal over a long distance without distortion of the waveform of the optical signal. An MQW modulation layer is formed by alternately stacking a quantum well layer and a barrier layer, where the quantum well layer includes quantum dots whose material is smaller in energy band-gap than a material constituting a quantum well layer. The pin structure is formed by means of interposing an MQW modulation layer between an intrinsic n-type cladding layer and an intrinsic p-type cladding layer.

Further, the collection of proceedings relating to the 45th Allied 15 Symposium of Applied Physics (29a-SZL-24, at Tokyo Engineering University, March, 1998) includes a paper describing a multiple quantum well electric field absorption type optical modulator, in which a blue chirp arises as a result a sandwiched thin buffer layer.

SUMMARY OF THE INVENTION

According to one aspect of the present invention, an optical modulator comprises a semiconductor substrate of a first conductivity type, a light absorption layer laid on the semiconductor substrate, and a semiconductor cladding layer of second conductivity type laid on the light absorption layer. The light absorption layer has a multiple quantum well structure. The multiple quantum well structure comprises a first well layer and a plurality of second well layers, and the peak wavelength of absorption spectrum of the second well layer is shorter than the peak wavelength of absorption spectrum of the first well layer.

In another aspect, in the optical modulator, preferably the first well layer positioned closest to the semiconductor substrate has the longest peak wavelength of absorption spectrum.

In another aspect, in the optical modulator, preferably the first well layer is thicker than the second well layer.

In another aspect, in the optical modulator, preferably the band-gap wavelength of the first well layer is longer than the band-gap wavelength of the second well layer.

In another aspect, in the optical modulator, a plurality of first well layers may be employed, and a barrier layer sandwiched between the first well layers has a thickness at which carriers bind together within the space between the first well layers by means of an electric field corresponding to an extinction voltage.

In another aspect, in the optical modulator, preferably the peak wavelength of an absorption spectrum of the first well layer is longer than the peak wavelength of an absorption spectrum of the second well layer by 10 nm or more.

In another aspect, in the optical modulator, preferably the barrier layer interposed between the first and second well layers is thicker than the barrier layer sandwiched between the second well layers.

According to another aspect, a semiconductor laser device is provided which comprises a semiconductor laser and one of the optical modulators as stated above integrally manufactured on a same semiconductor substrate.

According to another aspect, an optical communications system is provided which comprises one of the optical modulators as stated above or the semiconductor laser device equipped with an optical modulator.

Other features and advantages of the invention will be apparent from the following description taken in connection with the accompanying drawings.

BRIEF DESCRIPTION OF THE DRAWINGS

FIGS. 6 through 8B are cross-sectional views showing an optical modulator described in the sequential order of a process of manufacturing the optical modulator in the first embodiment.

DETAILED DESCRIPTION OF THE PREFERRED EMBODIMENTS

Prior to description of preferred embodiments of the present invention, the problem which the present invention is to solve will be analyzed and described in detail.

According to Eq. (1) of the Kramers-Kronig relation, the refractive index of an electroabsorption modulator (EAM) 14 is changed in accordance with a change in the absorption spectrum of the light absorption layer 3. As a result, a variation arising in the wavelength of light emitted from the optical modulator 14; that is, the amount of chirping (Δλ), is expressed as Eq. (2).

$$\Delta\lambda = -\alpha_p \left(\frac{\lambda_0^2}{4\pi c}\right)\left(\frac{1}{P}\right)\frac{dp}{dt} \qquad (2)$$

Here, $\alpha_p$ denotes an α parameter of the EAM; $\lambda_0$ denotes the wavelength of incident light; "c" denotes the speed of light; and P denotes light intensity. Further, dP/dt denotes the rate of chronological change in light intensity.

An α parameter $\alpha_p$ is expressed by Eq. (3) in terms of the amount of change in absorption spectrum Δα and the amount of changes in refractive index Δn of an optical modulator.

$$\alpha_p = \frac{4\pi}{\lambda_0}\left(\frac{\Delta n}{\Delta\alpha}\right) \qquad (3)$$

Figure 32:
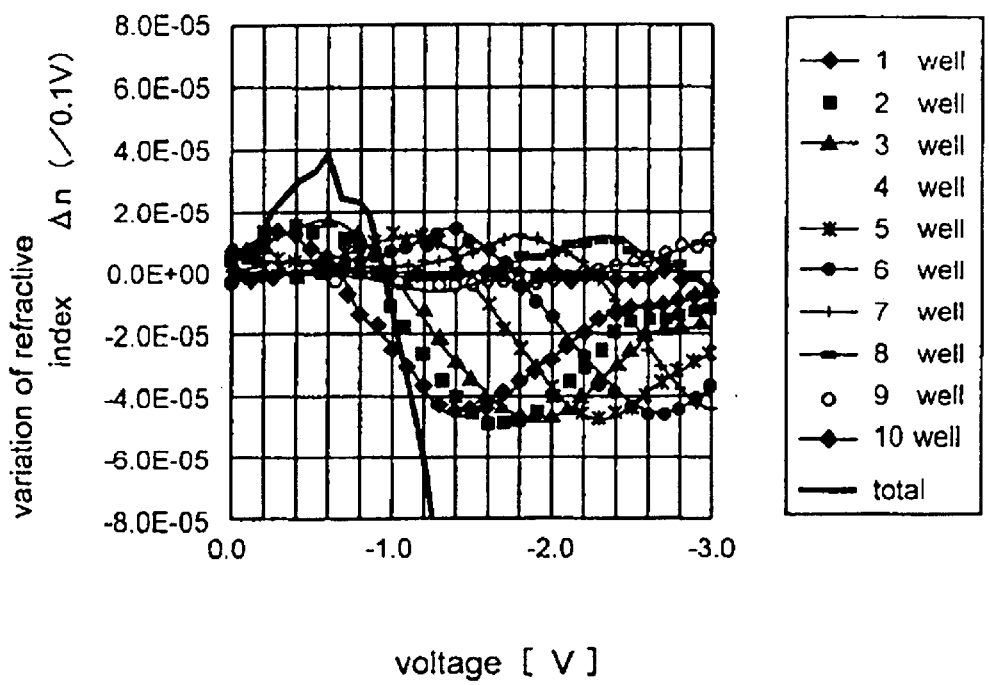
FIG. 32 is a graph showing a relationship between voltage applied to the optical modulator and variations in the refractive index of the conventional optical modulator.

FIG. 32 is a graph showing a relationship between voltage applied to the optical modulator (EAM) 14 and variations in the refractive index of the optical modulator 14, wherein the optical modulator 14 has a light-absorption layer of a conventional MQW structure comprising uniform well layers and uniform barrier layers.

Figure 33:
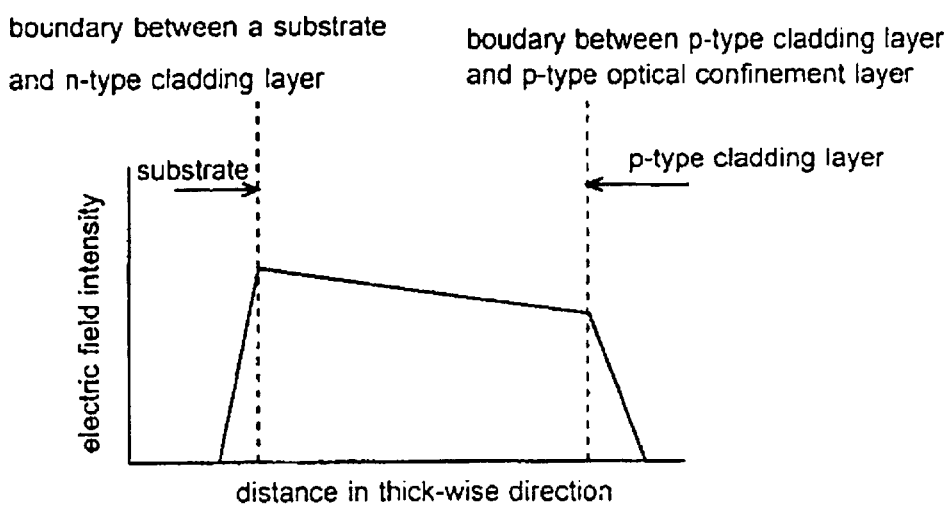
FIG. 33 is a graph showing the distribution of an electric field applied to the light absorption layer in the conventional optical modulator.

FIG. 33 is a graph showing the distribution of an electric field applied to a light absorption layer.

Figure 28:
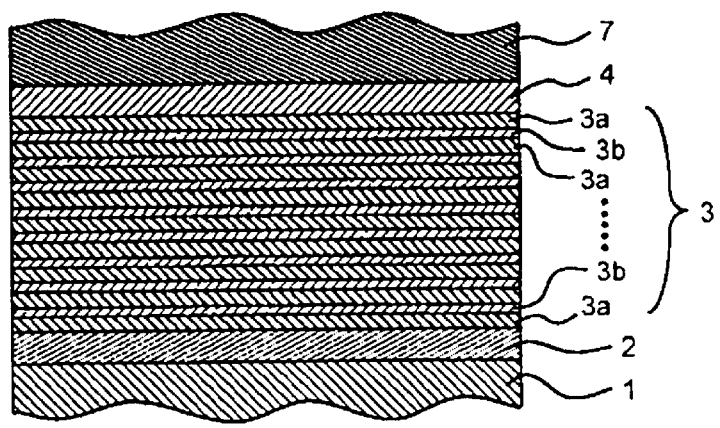
FIG. 28 is a cross-sectional view showing a light absorption layer of the conventional optical modulator.
Figure 29:
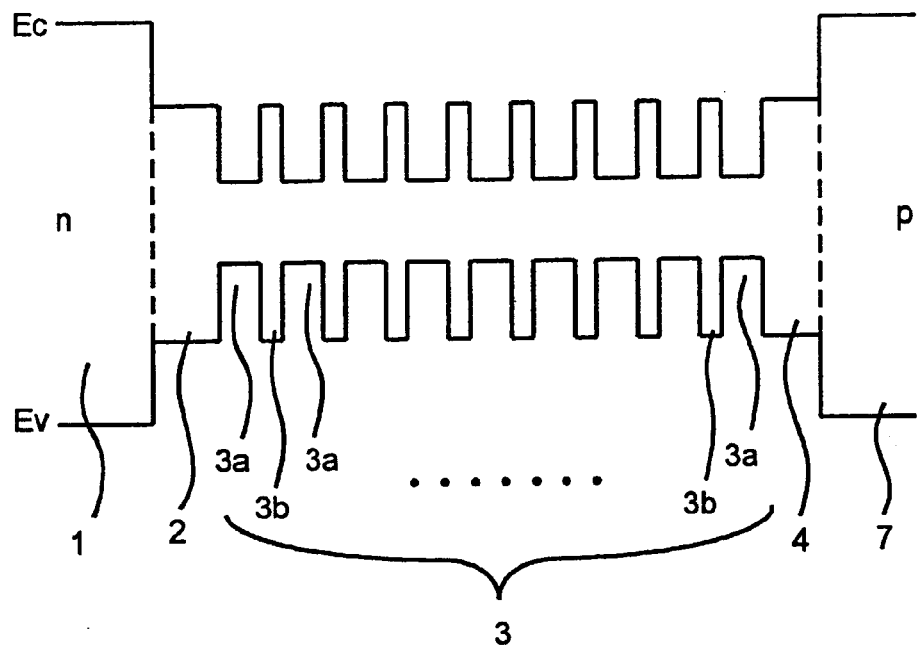
FIG. 29 is a conceptual energy diagram of the light absorption layer of the conventional optical modulator.
Figure 30:
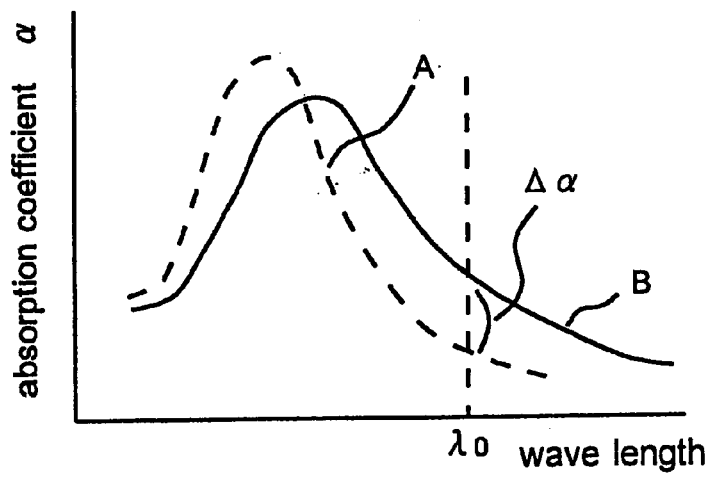
FIG. 30 is a conceptual graph showing an absorption spectrum of the conventional optical modulator.
Figure 31A:
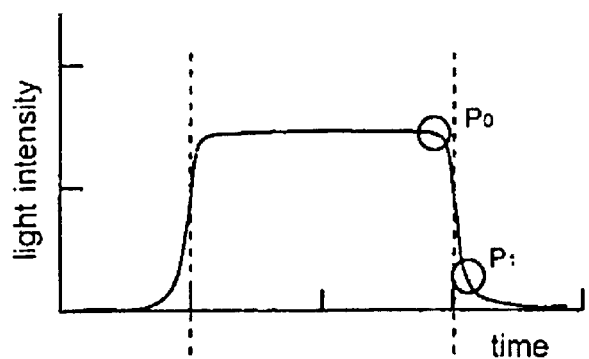
FIGS. 31A and 31B are conceptual graphs showing the relationship between chronological change in light intensity and a chirping phenomenon in a conventional optical modulator.
Figure 31B:
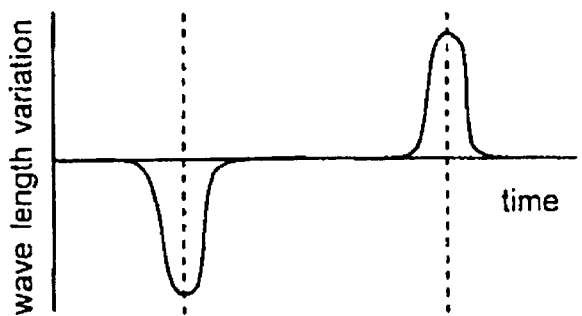

A model used for the computation shown in FIG. 32 corresponds to the optical modulator 14 having the light absorption layer 3 with an MQW structure shown in FIGS. 28 and 29. The electric field shown in FIG. 33 exhibits the highest intensity at a position between a semiconductor substrate 1 and an n-type optical confinement layer 2. The intensity of the electric field drops linearly from that position to a boundary area between a p-type optical confinement layer 4 and a p-type cladding layer. The relationship between voltage applied to the optical modulator 14 and variation in the refractive index of the optical modulator 14 is calculated, provided that the electric field has been applied to the MQW structure of the light absorption layer 3.

The dependence on a bias voltage of an absorption spectrum induced by an absorption phenomenon which arises within a range between the ground state of electrons and the ground state of heavy positive holes, and the dependence on a bias voltage of an absorption spectrum induced by an absorption phenomenon which arises within a range between the ground state of electrons and the ground state of light positive holes are calculated for each of ten well layers 3a, while absorption of light induced by free carriers is neglected. A variation in the refractive index of each of the well layers 3a is determined, by means of converting the thus-calculated dependence of absorption spectrum on a bias voltage through Kramers-Kronig conversion.

In FIG. 32, reference numerals 1 well, 2 well, 3 well, ... 10 well designate the numbers assigned to the respective well layers 3a when counted from the n-type optical confinement layer 2. Further, reference symbol "total" designates the total of variations in refractive indices of the respective well layers 3a which are assigned numbers 1 well, 2 well, 3 well, ..., 10 well.

The absorption coefficient of the optical modulator 14 is equal to the total of absorption coefficients of the respective well layers 3a. Further, in terms of the linearity of an absorption coefficient in the Kramers-Kronig equation, a variation in the refractive index of the optical modulator 14 is equal to the total of variations in refractive indices of the respective well layers 3a.

Figure 34:
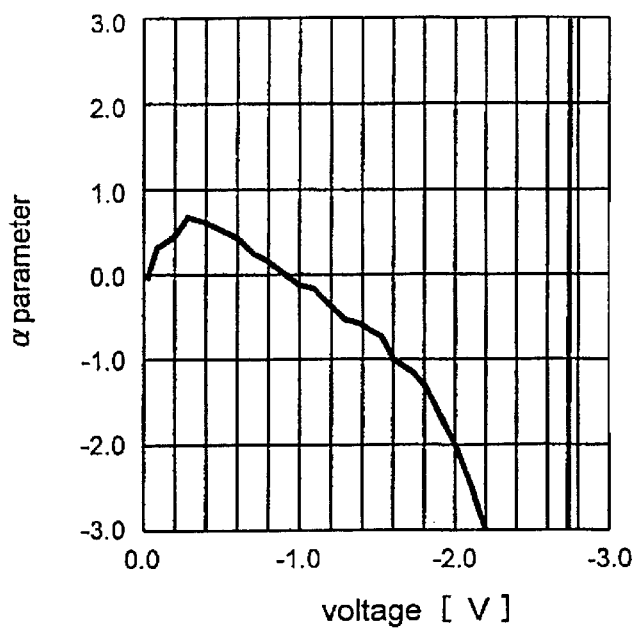
FIG. 34 is a graph showing a relationship between the voltage applied to the optical modulator and the α parameter.

FIG. 34 is a graph showing a relationship between the voltage applied to the optical modulator 14 and the α parameter, the relationship being induced from a variation in refractive index (Δn) and a variation in absorption coefficient (Δα).

In a case where the voltage applied to the optical modulator 14 is increased from a negative value to 0V, a test shows the α parameter also increases gradually, but the computational results show that the α parameter decreases within the range of −0.3V to 0V. Such a decline in α parameter is thought to be attributable to a computational error. However, dV/dt in Eq. (2) usually assumes a small value within the range of −0.3V to 0V, and the transmission characteristic of the optical modulator 13 is determined primarily within a range where the voltage applied to the optical modulator 14 assumes a value of −0.3 V or smaller (i.e., a range where the voltage assumes a greater absolute value). For this reason, the decline in α parameter is not particularly significant. Within the range where the voltage assumes a value of −0.3V or less, the computational results match test values very well.

As can be seen from the graph shown in FIG. 34, in the optical modulator 14 having the light absorption layer 3 of an MWQ structure, the layer 3 comprising uniform well layers and uniform barrier layers, the α parameter assumes a positive value within the range where the bias voltage assumes a value of 0V to 1.0V or thereabouts. More specifically, a positive variation arises in the refractive index of the light absorption layer 3.

Provided that the intensity of the light output from the optical modulator 14 is taken as Po and the intensity of the light entering the optical modulator 14 is taken as Pin, the relationship between Po and Pin is expressed by Eq. (4) as follows:

$$P_o = P_{in} \times \exp(-\alpha \cdot L) \qquad (4)$$

where L is the length of the optical modulator 14.

When the voltage applied to the optical modulator 14 is taken as V1, the absorption coefficient of the optical modulator 14 and the intensity of the light output from the optical modulator 14 are taken as α1 and P1, respectively. Further, when the voltage applied to the optical modulator 14 is taken as V2, the absorption coefficient of the optical modulator 14 and the intensity of the light output from the optical modulator 14 are taken as α2 and P2, respectively. In this case, an extinction ratio Ex obtained when the voltage applied to the optical modulator 14 is changed from V1 to V2 is expressed by Eq. (5) as follows:

$$E_x = -10 \times \log(P_2/P_1) = \\ -10 \times \log(P_{in} \times \exp(-\alpha_2 \cdot L) / P_{in} \times \exp(-\alpha \cdot L)) = \\ \frac{10}{\ln 10} \times (\alpha_2 - \alpha_1) \cdot L \qquad (5)$$

The unit of the extinction ratio Ex is dB.

Figure 35:
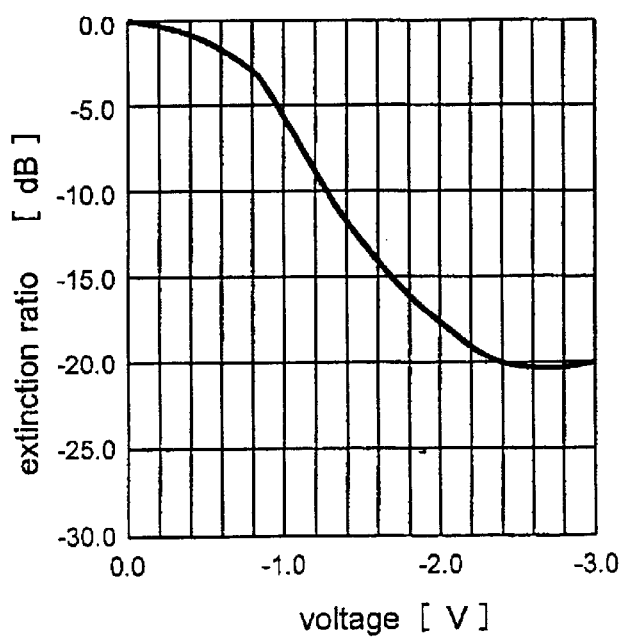
FIG. 35 is a graph showing the voltage dependence of the extinction ratio of the conventional optical modulator.

FIG. 35 is a graph showing the voltage dependence of the extinction ratio of the optical modulator 14 with the light absorption layer 3 of MQW structure obtained through use of Eq. (5), wherein the light absorption layer 3 includes uniform well layers and uniform barrier layers.

The present invention embodied as described below has been conceived on the basis of detailed analysis of variations in the refractive index of the conventional optical modulator 14 with the light absorption layer 3 of MQW structure, the layer including uniform well layers and uniform barrier layers.

By way of example, the following embodiments describe an electro-absorption external light modulator of 10 Gb/s used for main line transmission, a semiconductor laser device equipped with an optical modulator, and an optical communications system.

First Embodiment

The present embodiment is intended to diminish variation in the refractive index of the overall multiple quantum well layer within a range where a bias voltage having a small absolute value is applied to an optical modulator, by means of increasing the thickness of the well layer closest to an n-type optical confinement layer, thus inducing a large negative variation in the refractive index of the well layer.

Figure 1:
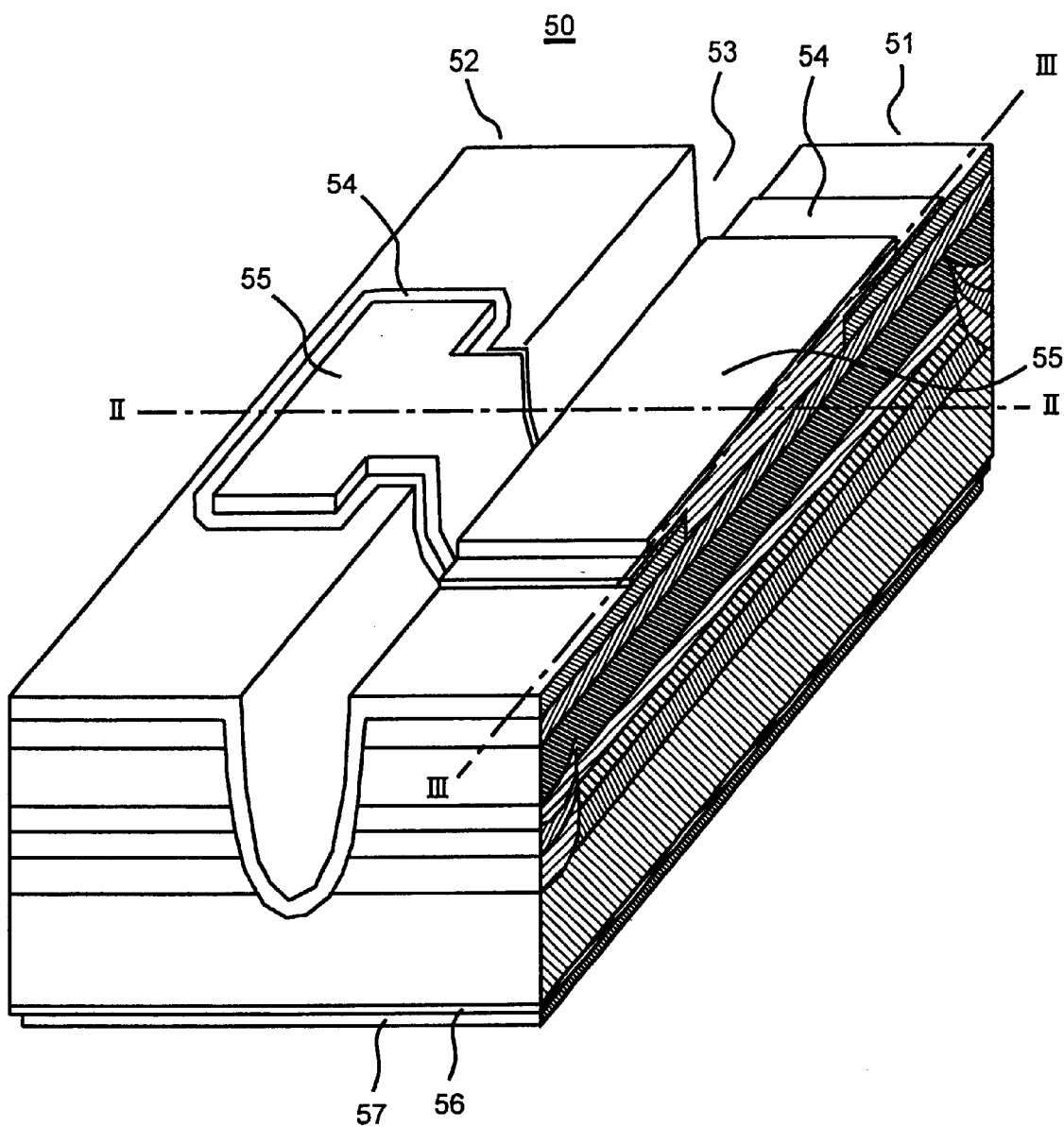
FIG. 1 is a perspective cross-sectional view showing an optical modulator according to a first embodiment of the present invention.

FIG. 1 is a perspective cross-sectional view showing an optical modulator according to a first embodiment of the present invention.

Figure 2:
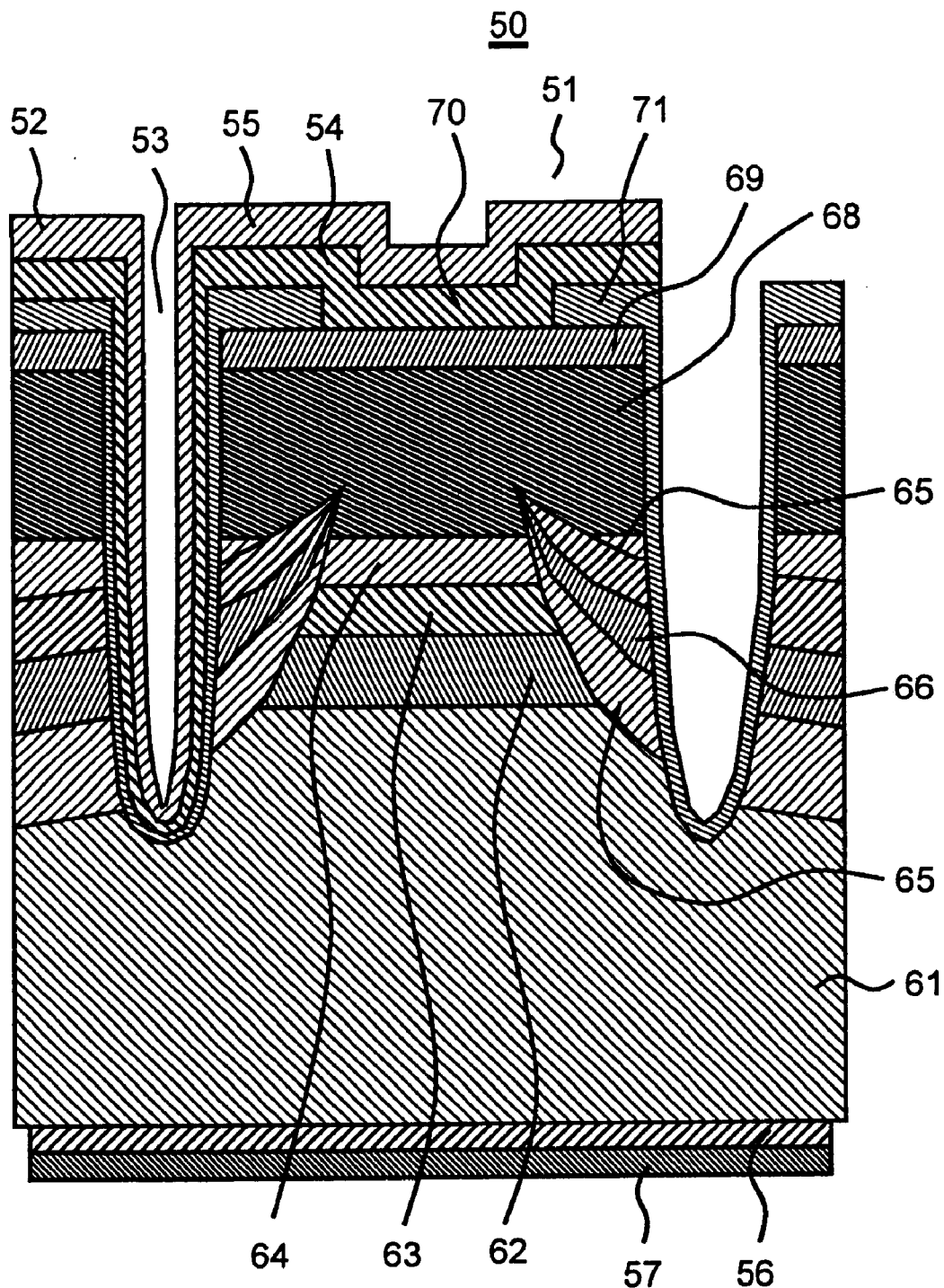
FIG. 2 is a cross-sectional view of the optical modulator taken along line II—II shown in FIG. 1.
Figure 3:
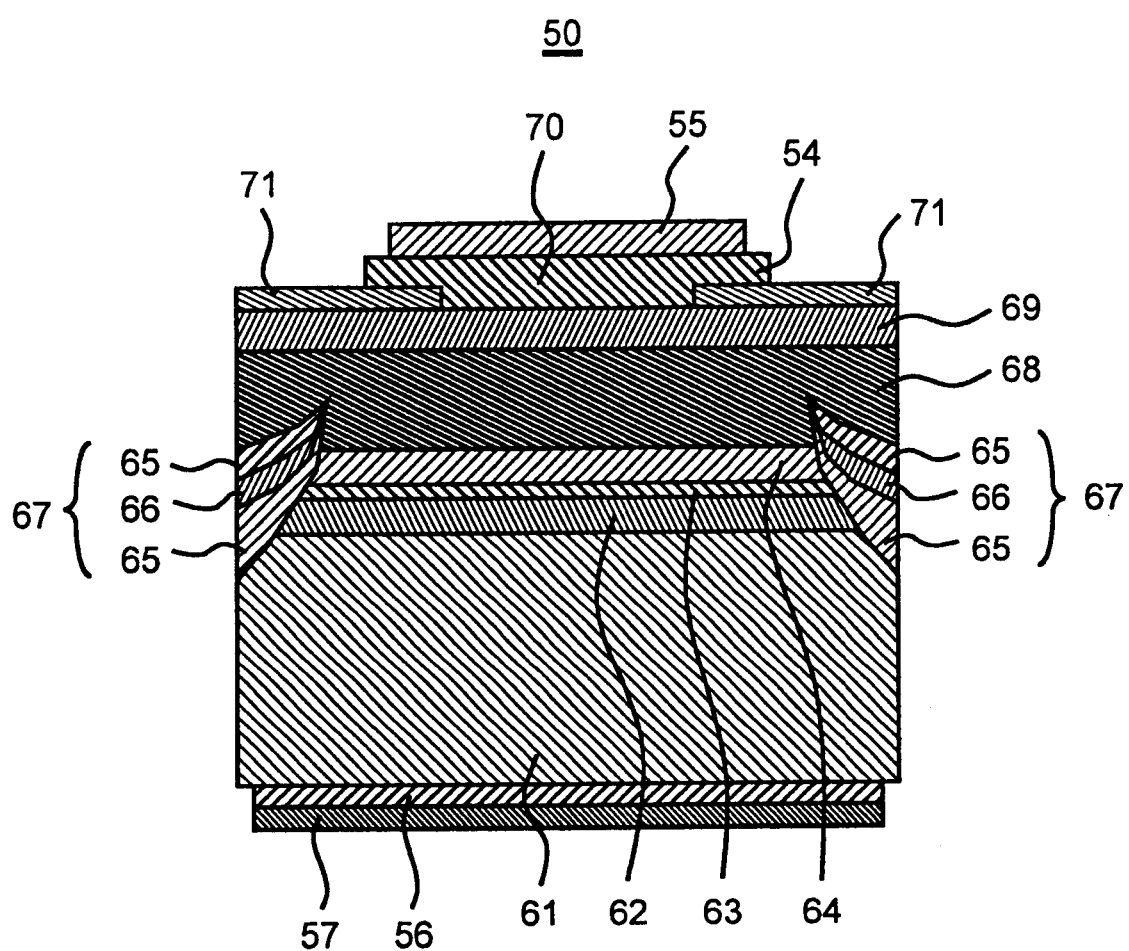
FIG. 3 is a cross-sectional view of the optical modulator taken along line III—III shown in FIG. 1.

FIG. 2 is a cross-sectional view of the optical modulator taken along line II—II shown in FIG. 1. A right-side half portion cut away in FIG. 1 is included in FIG. 2. FIG. 3 is a cross-sectional view of the optical modulator taken along line III—III shown in FIG. 1.

In FIGS. 1 through 3, reference numeral 50 designates an electroabsorption modulator (EAM); 51 designates a mesa portion of the optical modulator 50; 52 designates an electrode pad portion; 53 designates an isolation trench for isolating the mesa portion 51 from the electrode pad 52; 54 designates a surface electrode of the optical modulator 50; 55 designates a surface plating layer provided on the surface electrode 54; 56 designates an underside electrode provided on the lower surface of the optical modulator 50; and 57 designates an underside plating layer.

In FIGS. 2 and 3, reference numeral 61 designates a substrate formed from n-inp; 62 designates an n-type optical confinement layer which is laid on the substrate 61 and formed from n-InGaAsP; 63 designates a light absorption layer which is laid on the n-type optical confinement layer 62, which is formed from InGaAsP, and which has a multiple quantum well structure; and 64 designates a p-type optical confinement layer which is laid on the light absorption layer 63 and is formed from p-InGaAsP.

The n-type optical confinement layer 62, the light absorption layer 63, and the p-type optical confinement layer 64 constitute an optical waveguide and are formed into a ridge pattern in the direction of the waveguide. A multilayer structure formed by means of an n-InP embedded layer 66 being sandwiched between two Fe-doped InP embedded layers 65 is laid on either side of the ridge-shaped optical waveguide formed from the n-type optical confinement layer 62, the light absorption layer 63, and the p-type light confinement layer 64.

Similarly, as shown in FIG. 3, an embedded window layer 67 formed by means of sandwiching the n-InP embedded layer 66 between the two Fe-doped InP embedded layers 65 is laid on either longitudinal side of an optical waveguide, the optical waveguide being formed from the optical confinement layer 62, the light absorption layer 63, and the p-type optical confinement layer 64.

Reference numeral 68 designates a p-type cladding layer formed from p-InGaAsP, and the p-type cladding layer 68 is laid so as to cover the p-type optical confinement layer 64 of the ridge-shaped waveguide, and the Fe-doped InPembedded layer 65. Reference numeral 69 designates a contact layer formed from p-InGAs, the contact layer 69 being laid on the p-type cladding layer 68.

A dielectric film 71, which is formed from $SiO_2$ and has an opening 70, is laid on the contact layer 69. The surface electrode 54 formed from Ti/Au is laid on the contact layer 69 via the opening 70, and the surface plating layer 55 formed from Au is laid on the surface electrode 54.

The underside electrode 56 formed from Au/Ge/Ti/Pt/Ti/Pt/Au layers is formed on the underside of the n-InP substrate 61, and the underside plating layer 57 formed from Au is laid on the surface of the underside electrode 56.

Figure 4:
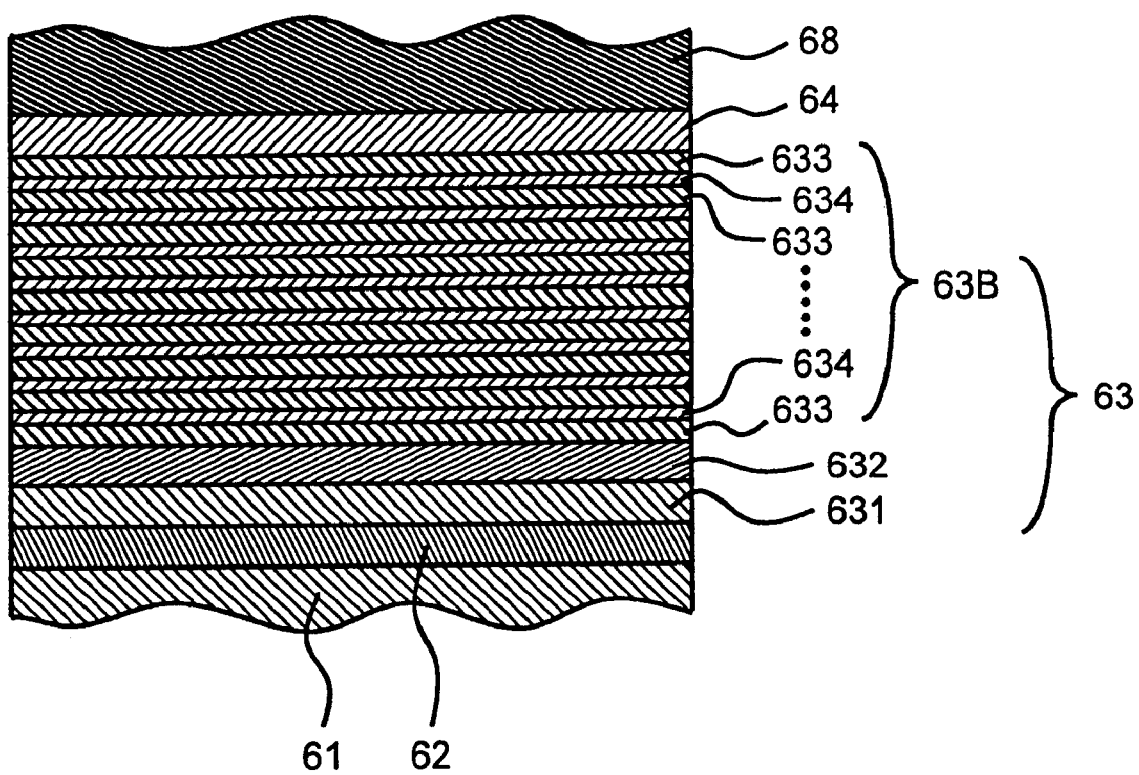
FIG. 4 is a cross-sectional view showing a light absorption layer according to the first embodiment.

FIG. 4 is a cross-sectional view showing a light absorption layer 63 according to the first embodiment.

In FIG. 4, the light absorption layer 63 designates a multiple quantum well (MQW) structure. Reference number 631 designates an 'A' well layer which serves as a first well layer located closest to the n-type optical confinement layer 62, is formed from undoped InGaAsP having a band-gap wavelength of 1.54 $\mu$m, and has a thickness of 8.5 nm. Reference number 633 designates a 'B' well layer which is formed to a thickness of 7.5 nm from undoped InGaAsP having a band-gap wavelength of 1.54 $\mu$m.

Reference numeral 634 designates a 'B' barrier layer which is formed to a thickness of 6 nm from undoped InGaAsP having a band-gap wavelength of 1.18 $\mu$m. Nine 'B' well layers 633 and nine 'B' barrier layers 634 are alternately formed, to uniformly thickness. A multilayer formed from the B' well layers 633 and the B' barrier layers 634 is called a uniform multiple quantum well section 63B.

Reference numeral 632 designates an 'A' barrier layer which is interposed between the 'A' well layer 631 and the 'B' well layer 633 and is formed from undoped InGaAsP to a thickness of 20 nm. The thickness of the 'A' barrier layer 632 is increased in order to prevent occurrence of a drop in oscillator strength, which would otherwise be caused by the occurrence of binding between the 'A' well layer 631 and the 'B' well layer 633.

Figure 5:
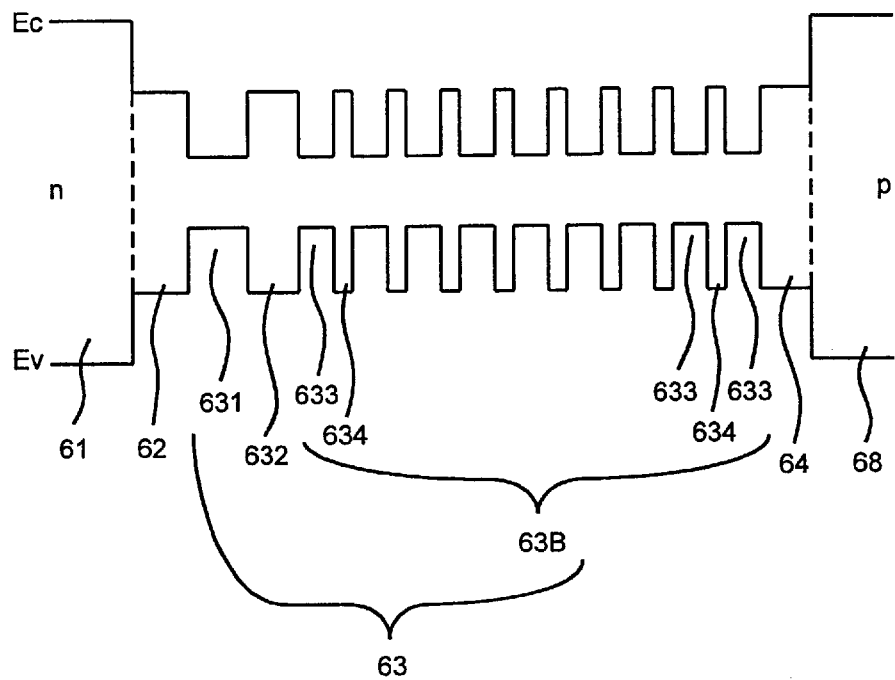
FIG. 5 is a diagram showing an energy band in the vicinity of the light absorption layer according to the first embodiment.

FIG. 5 is a diagram showing an energy band in the vicinity of the light absorption layer 63 according to the first embodiment. Reference symbol Ec designates a conduction band, and Ev designates a valance electron band.

A method of manufacturing the optical modulator 50 according to the first embodiment will now be described.

FIGS. 6 through 8B are cross-sectional views showing an optical modulator described in the sequential order of a process of manufacturing the optical modulator 50.

Figure 6:
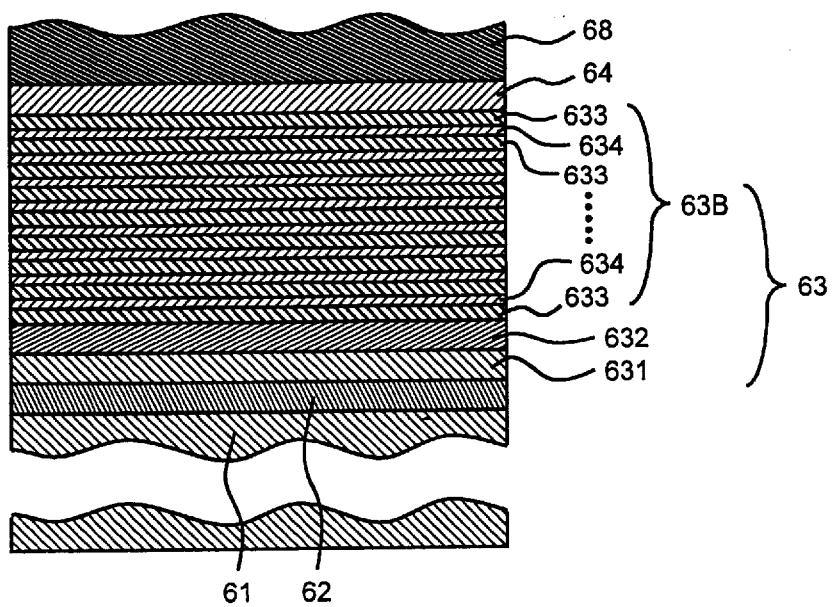
Figure 7:
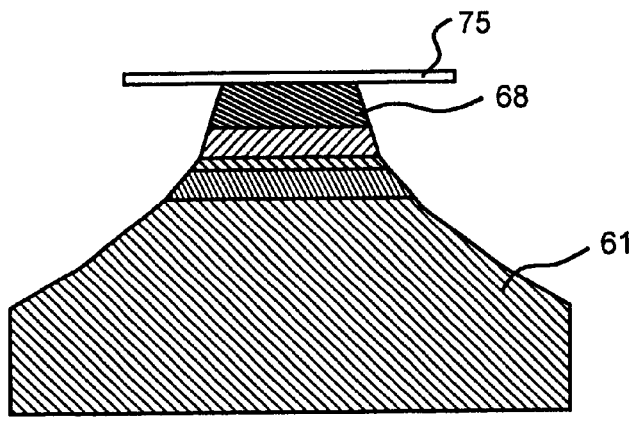
Figure 7:
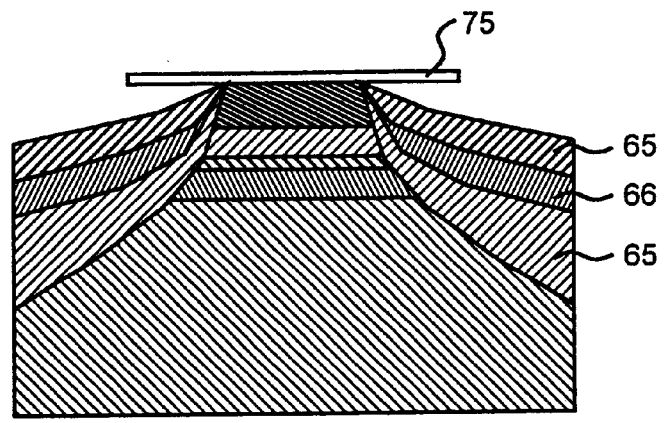
Figure 8:
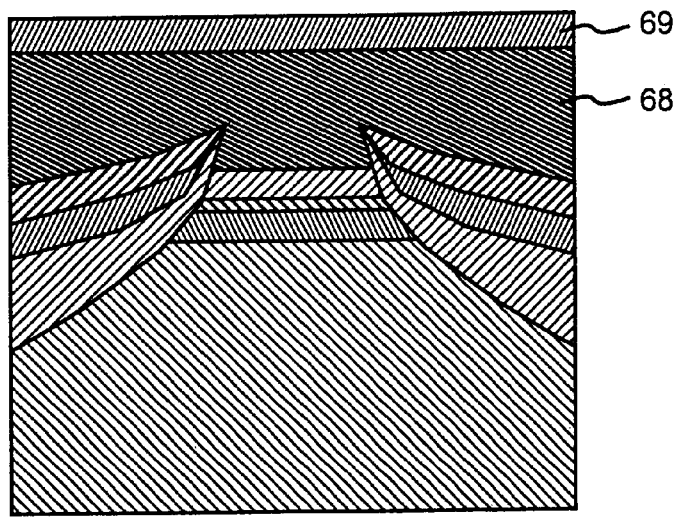
Figure 8:
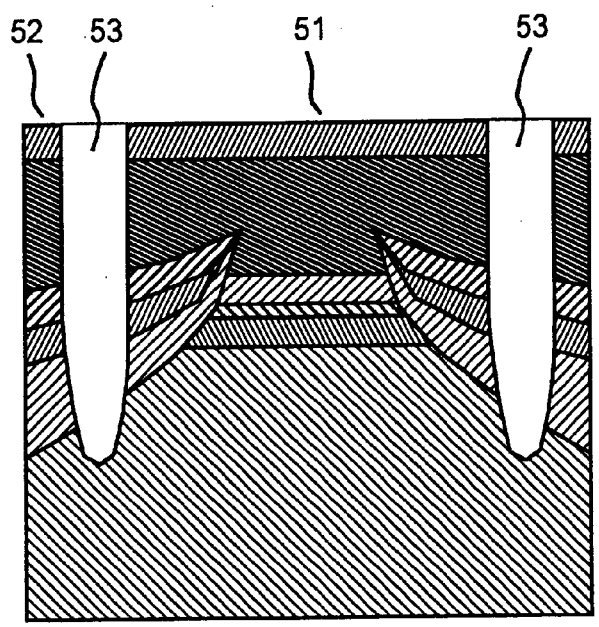

As shown in FIG. 6, on the n-InP substrate 61 there are formed, through crystal growth according to the MOCVD technique, an n-InGaAsP layer serving as the n-type optical confinement layer 62, an MQW layer which is formed from undoped InGaAsP and serves as the optical absorption layer 63, a p-InGaAsP layer serving as the p-type optical confinement layer 64, and a p-InGaAsP layer serving as a p-cladding layer 68. FIG. 6 shows the results of crystal growth of the above-described layers.

Next, an $SiO_2$ film is formed on the surface of the p-InGaAsP layer serving as the p-cladding layer 68, and the thus-formed $SiO_2$ film is etched into a stripe pattern in the direction in which light is guided. After a mask pattern 75 has been formed from $SiO_2$ film (see FIG. 7A), a wafer is etched to the substrate 61 while the mask pattern 75 is used as a mask, to thereby constitute a ridge-shaped waveguide having a mesa structure. FIG. 7A shows the thus-formed waveguide.

The Fe-doped InP embedded layer 65, the n-InP embedded layer 66, and again the Fe-doped InP embedded layer 65 are formed by means of the MOCVD technique, in the sequence given, on either side of the ridge-shaped waveguide while the mask pattern 75 is taken as a selective growth mask (see FIG. 7B).

Simultaneously with formation of the ridge-shaped waveguide with a mesa structure, an end face on either longitudinal end of the waveguide through which light travels is etched, to thereby form the window layer 67 from the Fe-doped InP embedded layer 65 and the n-InP embedded layer 66. FIG. 7B shows the thus-formed window layer 67.

Subsequently, the mask pattern 75 formed from a $SiO_2$ film is removed, and a p-InGaAsP layer which is to serve as the p-cladding layer 68 and p-InGaAs layer which is to serve as the contact layer 69 are sequentially formed on the wafer. FIG. 8A shows the wafer in which the p-cladding layer 68 and the contact layer 69 are formed.

Subsequently, the isolation trench 53 is formed through a photolithography step and an etching step, to thereby isolate the mesa portion 51 and the electrode pad 52. FIG. 8B shows the wafer in which the isolation trench 53 is formed.

The $SiO_2$ dielectric film 71 is formed over the mesa 51, the electrode pad 52, and the isolation trench 53, as shown in FIG. 2. The opening 70 is formed in the $SiO_2$ dielectric film 71 in order to establish connection with the contact layer 69. A Ti/Au film which is to act as the surface electrode 54 is deposited on the wafer, and an Au layer which is to act as the surface plating layer 55 is formed over the Ti/Au film.

The underside of the substrate 61 is polished, and an Au/Ge/Ti/Pt/Ti/Pt/Au layer which is to act as the underside electrode 56 is formed on the underside of the substrate 61, and the underside plating layer 57 formed from Au is formed on the surface of the underside electrode 56. FIG. 2 shows the structure of the thus-formed optical modulator 50.

The operation of the optical modulator 50 according to the embodiment will now be described.

Figure 9:
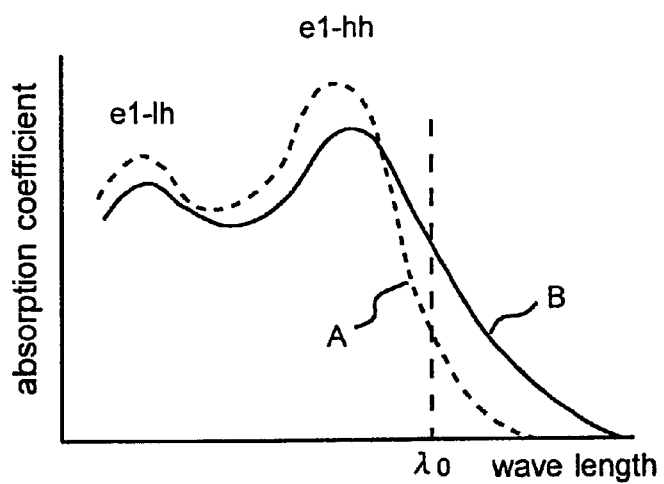
FIG. 9 is a graph showing an absorption spectrum of the uniform multiple quantum well section in the first embodiment.

FIG. 9 is a graph showing an absorption spectrum of the uniform multiple quantum well section 63B.

In FIG. 9, an absorption spectrum 'A' is denoted by a broken line and corresponds to an absorption spectrum which arises when no voltage is applied to the optical modulator 50. When an electric field having the same electric field distribution as that shown in FIG. 33 is applied to the optical modulator 50, the absorption spectrum 'A' turns into an absorption spectrum 'B' denoted by a solid line. $\lambda_0$ designates the wavelength of incident light. Symbol e1-hh denotes a transition arising within the range of the first electronic energy level and a heavy positive hole, and e1-lh denotes a transition arising within the range of the first electronic energy level and a light positive hole.

At the time of computation of the absorption spectra 'A' and 'B', only absorption of excitons arising within the range of the first electronic energy level and a heavy positive hole and absorption of excitons arising within the range of the first electronic energy level and a light positive hole are taken into consideration, and absorption of excitons caused by free carriers is neglected.

Figure 10:
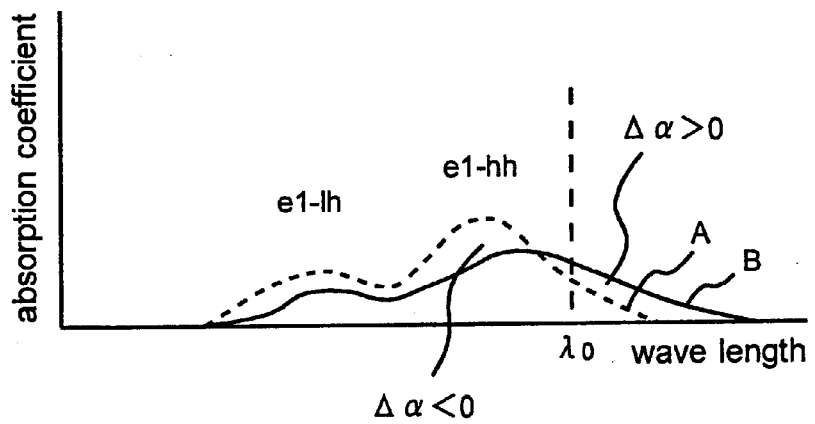
FIG. 10 is a graph showing the absorption spectrum of the 'A' well layer in the first embodiment.

FIG. 10 is a graph showing the absorption spectrum of the 'A' well layer 631.

In FIG. 10, an absorption spectrum 'A' is denoted by a broken line and corresponds to n absorption spectrum which arises when no voltage is applied to the optical modulator 50. When an electric field having the same electric field distribution as that shown in FIG. 33 is applied to the optical modulator 50, the absorption spectrum 'A' is converted into an absorption spectrum 'B' denoted by a solid line. $\lambda_0$ designates the wavelength of incident light.

As shown in FIG. 10, a decrease arises in the quantum energy level as a result of the width of a well layer being broadened by the 'A' well layer 631, wherewith the absorption spectra 'A' and 'B' are shifted toward a long-wavelength band. The peaks of absorption spectra of the uniform multiple quantum well section 63B shown in FIG. 9; particularly, the absorption spectrum induced by the transition (e1-hh) arising within the range of the first electronic energy level and a heavy positive hole, are shifted 10 nm or more toward a longer wavelength, relative to the absorption spectrum induced by the transition (e1-hh) arising within the range of the first electronic energy level and a heavy positive hole of the 'A' well layer 631 shown in FIG. 10. Variation $\Delta\alpha$ in the absorption coefficient of the 'A' well layer 631 is changed in the vicinity of the input wavelength $\lambda_0$ from $\Delta\alpha<0$ to $\Delta\alpha>0$.

Figure 11A:
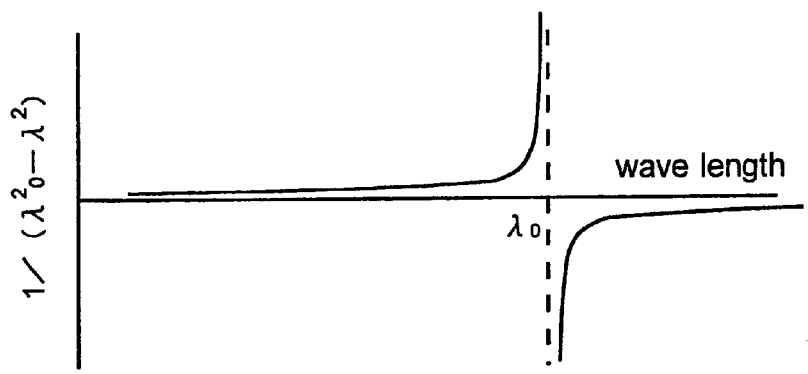
FIGS. 11A and 11B are graphs showing functions in the Kramers-Kronig equation.
Figure 11B:
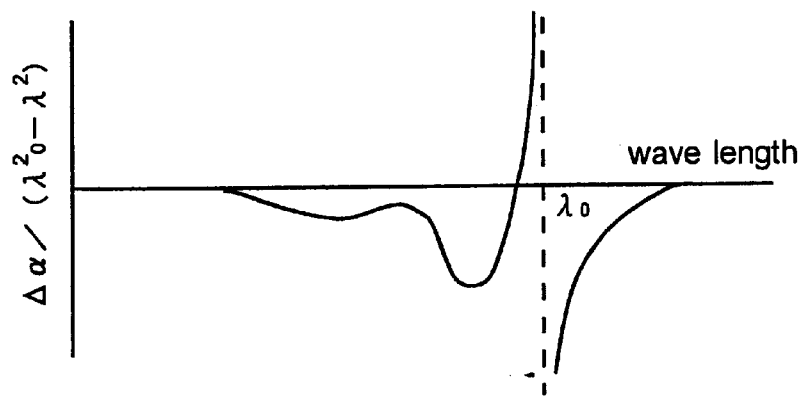

FIG. 11A is a graph showing a $1/(\alpha_0^2-\lambda^2)$ function of the Kramers-Kronig equation. FIG. 11B is a graph showing a $\Delta\alpha/(\lambda_0^2-\lambda^2)$ function of the Kramers-Kronig equation which takes into consideration $\Delta\alpha$ of the 'A' well layer 631.

Figure 12:
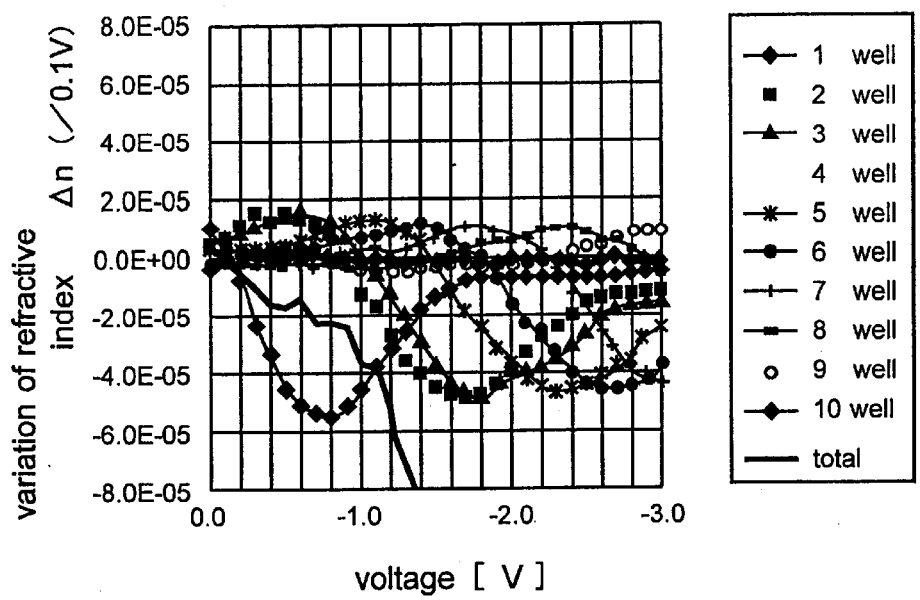
FIG. 12 is a graph showing the voltage dependence of variation in refractive index of the optical modulator in the first embodiment of the present invention.

FIG. 12 is a graph showing the voltage dependence of variation in refractive index of the optical modulator 50 according to the present invention.

In consideration of variation in $\Delta\alpha$ in the vicinity of the input wavelength $\lambda_0$ and the $1/(\lambda_0^2-\lambda^2)$ function of the Kramers-Kronig equation, there is derived a $\Delta\alpha/(\lambda_0^2-\lambda^2)$ function shown in FIG. 11B. A resultant function—which is derived by integration of the $\Delta\alpha/(\lambda_0^2-\lambda^2)$ function and by means of multiplying the integration result by $\lambda_0^2/(2\pi^2)$— corresponds to the amount of variation in the refractive index of the optical modulator 50.

The amount of variation in the refractive index of the 'A' well layer 631 is denoted by '1 well' shown in FIG. 12.

As can be seen from FIG. 12, in contrast with the curve of '1 well' in the case of an MQW structure of a conventional optical modulator (i.e., '1 well' shown in FIG. 32), the curve of '1 well' in the case of an MWQ structure of the optical modulator 50 is significantly shifted toward 0V. Further, variation in refractive index becomes greater within the range of −1.0V or greater (within the voltage range of small absolute values).

In spite of the fact that the 'A' well layer 631 is a single well layer, the amount of variation in refractive index may assume a greater negative value depending on the behavior of a $\Delta\alpha$ component in the vicinity of $\lambda_0$.

The amount of variation in each of well layers 1 through 10 is computed, to thereby obtain the total variation in refractive index of the overall well layer. If variation in the refractive index of the 'A' well 631 assumes a negative value, the total variation in refractive index also assumes a negative curve.

In the optical modulator 50 according to the present invention, it is understood that, in a case where a bias voltage ranges from 0V to −1.0V or thereabouts, great negative variation in the refractive index of the 'A' well layer 631 compensates for positive variation in refractive index of another well layer 633, thereby greatly diminishing the amount of variation in refractive index of the overall MQW structure of the optical modulator 50.

As mentioned above, the profile of variation in refractive index can be changed by means of changing the thickness of the 'A' well layer 631.

Figure 13:
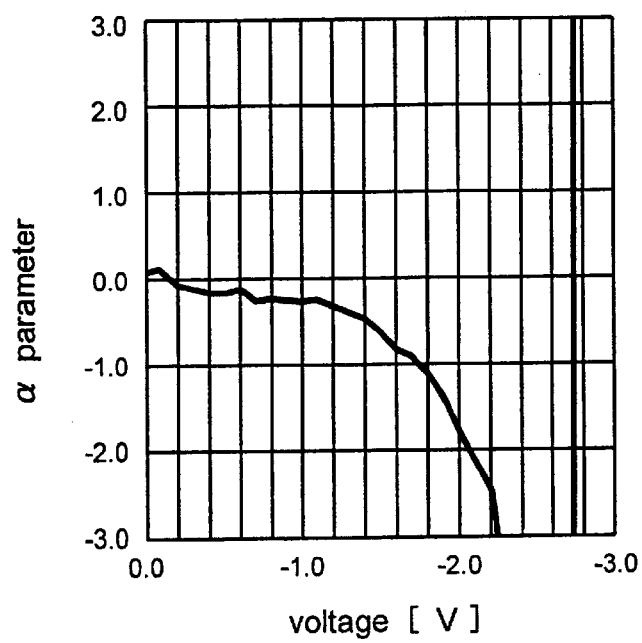
FIG. 13 is a graph showing an α parameter of the optical modulator in the first embodiment.

FIG. 13 is a graph showing the previously-computed α parameter of the optical modulator 50. In the optical modulator 50 according to the present invention, the α parameter assumes a substantially-negative value and does not cause positive variation in refractive index.

Figure 14:
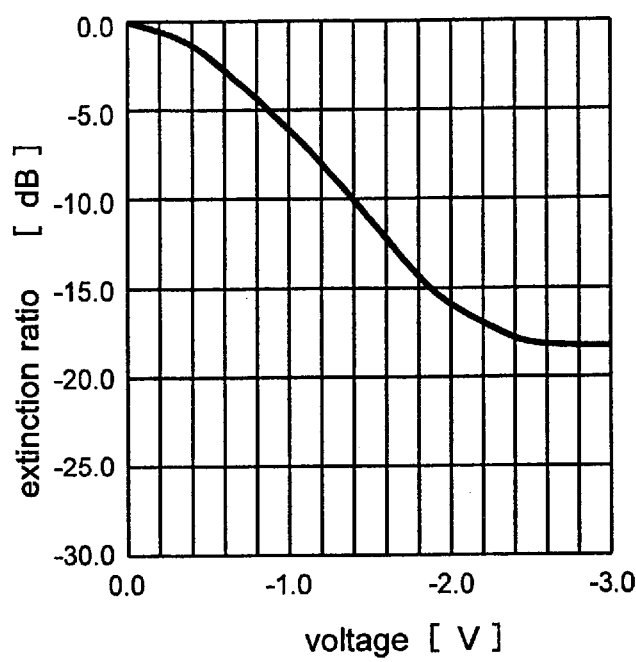
FIG. 14 is a graph showing an extinction ratio of the optical modulator in the first embodiment.

FIG. 14 is a graphs showing the previously-computed extinction ratio of the optical modulator 50. Comparison between the graph showing the extinction ratio of the optical modulator 50 and the graph (shown in FIG. 35) showing the extinction ratio of an optical modulator of a conventional structure shows that the graphs become substantially identical with each other.

The absorption coefficient of the 'A' well layer 631 relative to the wavelength $\lambda_0$ of incident light and the amount of variation in the absorption coefficient of the 'A' well layer 631 are sufficiently smaller than those of other well layers. Therefore, the optical modulator 50 is hardly susceptible to adverse effects, such as an increase in light loss or deterioration of an extinction ratio, and enables a change in the amount of variation in refractive index.

In this regard, the light loss induced by the optical modulator 50 at a bias voltage of 0V is 3.0 dB, and the light loss induced by the optical modulator 14 having a conventional structure is 3.6 dB. Further, the extinction ratio of the optical modulator 50 at a bias voltage of 0 to −2V is 18.0 dB, and the extinction ratio of the optical modulator 14 at a bias voltage of 0 to −2V is 16.0 dB.

In effect, since the amount of variation in refractive index of the optical modulator 50 can be improved, the amount of DC bias voltage applied to the optical modulator 50 can be reduced, which in turn diminishes light loss.

Drop in extinction ratio can be prevented by means of slightly increasing the length of an optical modulator. A limitation imposed on an increase in the length of an optical modulator; that is, an increase in the severity of a chirping phenomenon, which would otherwise be caused by increasing the length of an optical modulator, is greatly alleviated by the present invention.

As mentioned above, in an optical modulator according to the present invention, variation in the refractive index of the optical modulator can be made negative within a range where a small voltage is applied to the optical modulator, without involvement of deterioration of an extinction ratio or light loss. Consequently, a chirping phenomenon can be reduced in severity while deterioration of an extinction ratio or light loss is suppressed.

Second Embodiment

According to a second embodiment of the present invention, in a multiple quantum well structure of a light absorption layer, a well layer closest to an n-type optical confinement layer is formed from a material whose band-gap wavelength is shifted toward a longer wavelength than are the band-gap wavelengths of other well layers.

Figure 15:
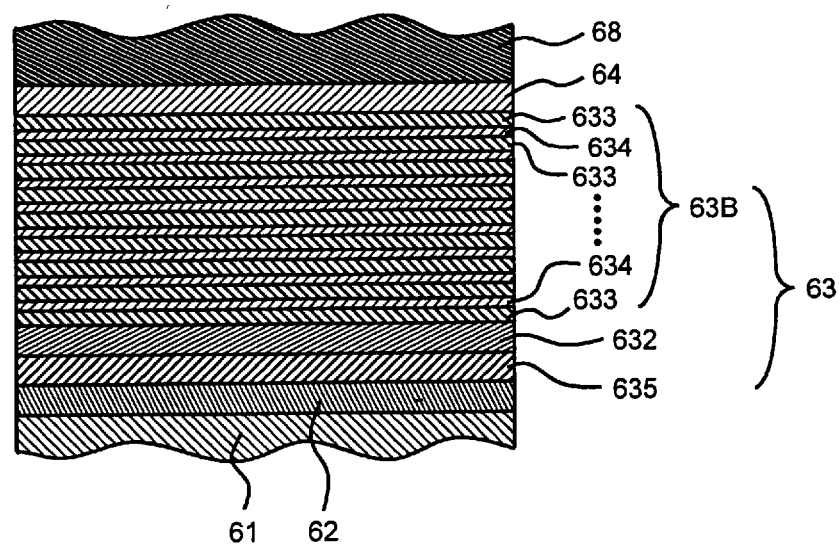
FIG. 15 is a cross-sectional view showing a multiple quantum well structure of a light absorption layer according to a second embodiment of the present embodiment.

FIG. 15 is a cross-sectional view showing a multiple quantum well structure of a light absorption layer according to the present embodiment. In FIG. 15, reference numeral 635 designates an 'A' well layer formed from a material, the material being made of InGaAsP and controlled such that the band-gap wavelength of the material is shifted toward a wavelength longer than that of the material of a 'B' well layer 633. The 'A' well layer 635 assumes a thickness of 7.5 nm, which is the same as that of the 'B' well layer 633.

Figure 16:
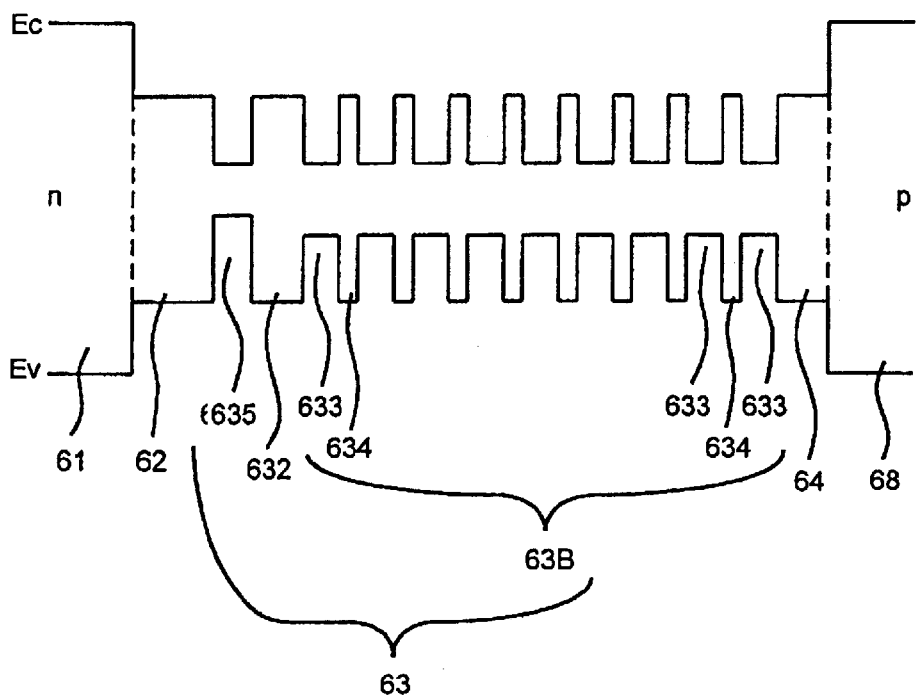
FIG. 16 is a schematic representation showing the energy band of the multiple quantum well structure shown in FIG. 15.

FIG. 16 is a schematic representation showing the energy band of the multiple quantum well structure shown in FIG. 15. By virtue of a drop in quantum energy level as a result of the band-gap wavelength of the 'A' well layer 635 being made longer than that of the 'B' well layer 633, the light absorption layer 63 having an MQW structure can produce the same absorption spectrum as that of the first embodiment shown in FIG. 10 and yield variation in absorption spectrum, which is induced by application of a bias voltage to an optical modulator.

Consequently, as in the case of the α parameter of the first embodiment shown in FIG. 13, in a case where a bias voltage ranges in the vicinity of the range of 0V to −1.0V, great variation in the refractive index of the 'A' well layer 635 compensates for positive variation in the refractive index of the 'B' well layer 633.

Consequently, the amount of variation in the refractive index of the overall light absorption layer 63 can be diminished.

Modification in the second embodiment

In the second embodiment, the 'A' well layer 635 is formed so as to assume the same thickness as that of the 'B' well layer 633. The 'A' well layer 635 may be formed from a material whose band-gap wavelength is longer than that of the material used for forming the 'B' well layer 633. Further, as in the case of the first embodiment, the 'A' well layer 635 may be formed so as to assume a large thickness; for example, a thickness of 8.5 nm.

Figure 17:
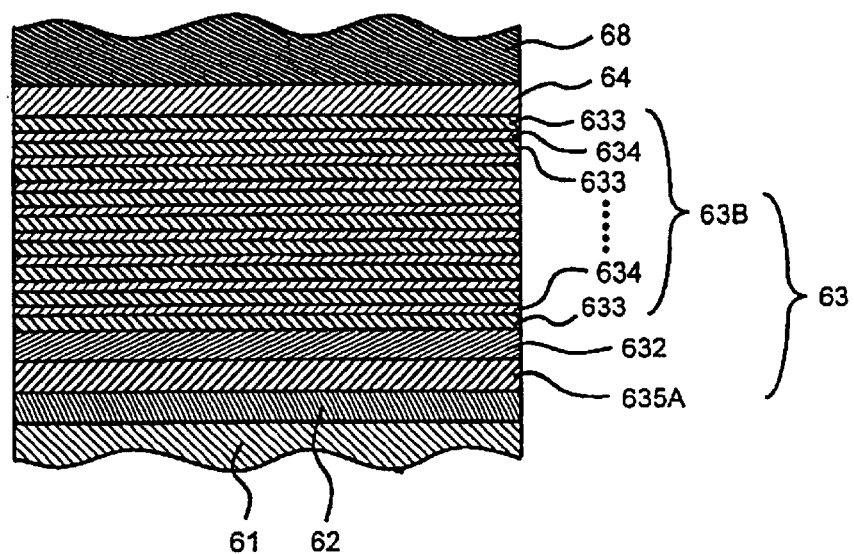
FIG. 17 is a cross-sectional view showing a multiple quantum well structure of a light absorption layer according to a modification of the second embodiment.
Figure 18:
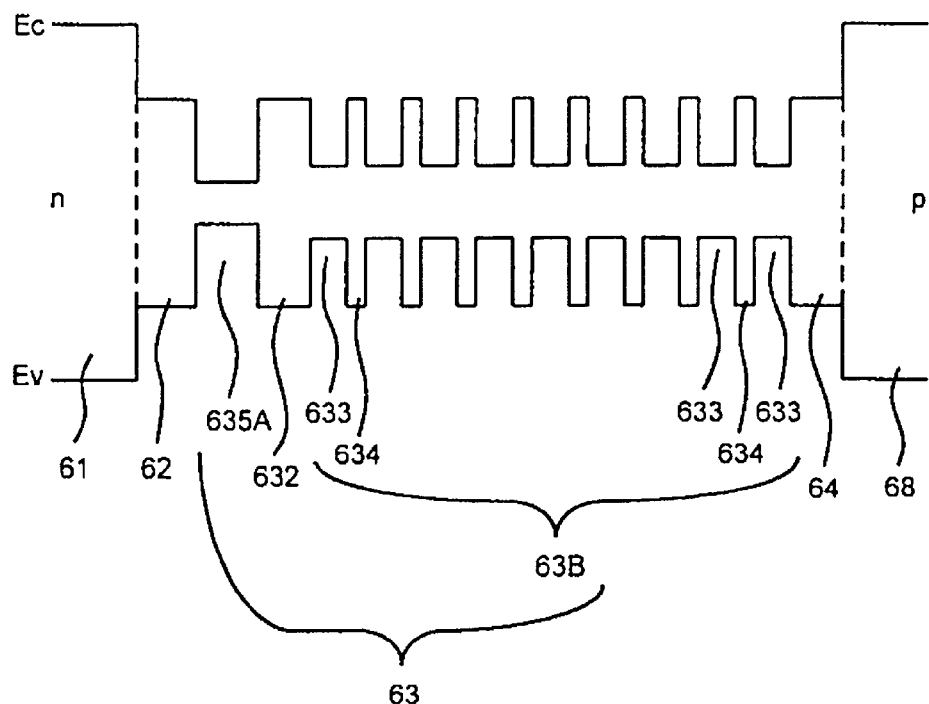
FIG. 18 is a schematic representation showing the energy band of the multiple quantum well structure shown in FIG. 17.

FIG. 17 is a cross-sectional view showing a multiple quantum well structure of a light absorption layer according to a modification of the second embodiment. FIG. 18 is a schematic representation showing the energy band of the multiple quantum well structure shown in FIG. 17.

In the multiple quantum well structure of the light absorption layer 63 according to the modification, by means of prolonging the time required for producing the 'A' well layer 635, as well as by means of controlling the composition of InGaAsP, an 'A' well layer 635A whose band-gap wavelength is longer than that of the 'B' well layer 633 is produced from InGaAsP so as to become thicker than the 'B' well layer 633.

With regard to combination of the band-gap wavelength of the 'A' well layer 635A and that of the 'B' well layer 633, the only requirement is that the energy produced from the quantum energy level of the 'A' well layer 635A be smaller than that produced from the quantum energy level of the 'B' well layer 633. So long as the band-gap wavelength of the 'A' well layer 635A is sufficiently long, the 'A' well layer 635A may be smaller in thickness than the 'B' well layer 633. In contrast, so long as the 'A' well layer 635A is sufficiently thicker than the 'B' well layer 633, the band-gap wavelength of the 'A' well layer 635A may be shorter than that of the 'B' well layer 633.

Third Embodiment

In a third embodiment of the present invention, a multiple quantum well structure of a light absorption layer is formed such that a thin barrier layer is sandwiched between two well layers as if to effectively constitute a single well layer while being adjacent to an n-type optical confinement layer.

Figure 19:
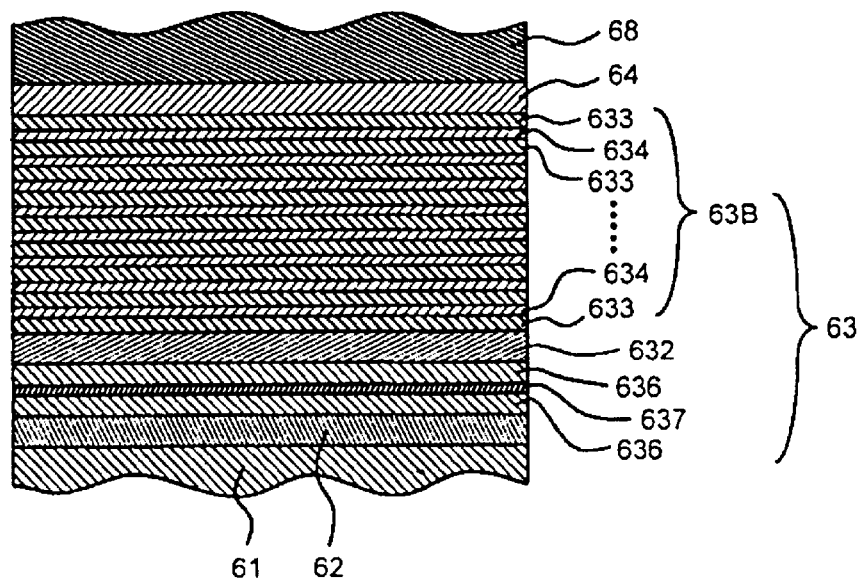
FIG. 19 is a cross-sectional view showing a multiple quantum well structure of the light absorption layer according to a third embodiment of the present invention.
Figure 20:
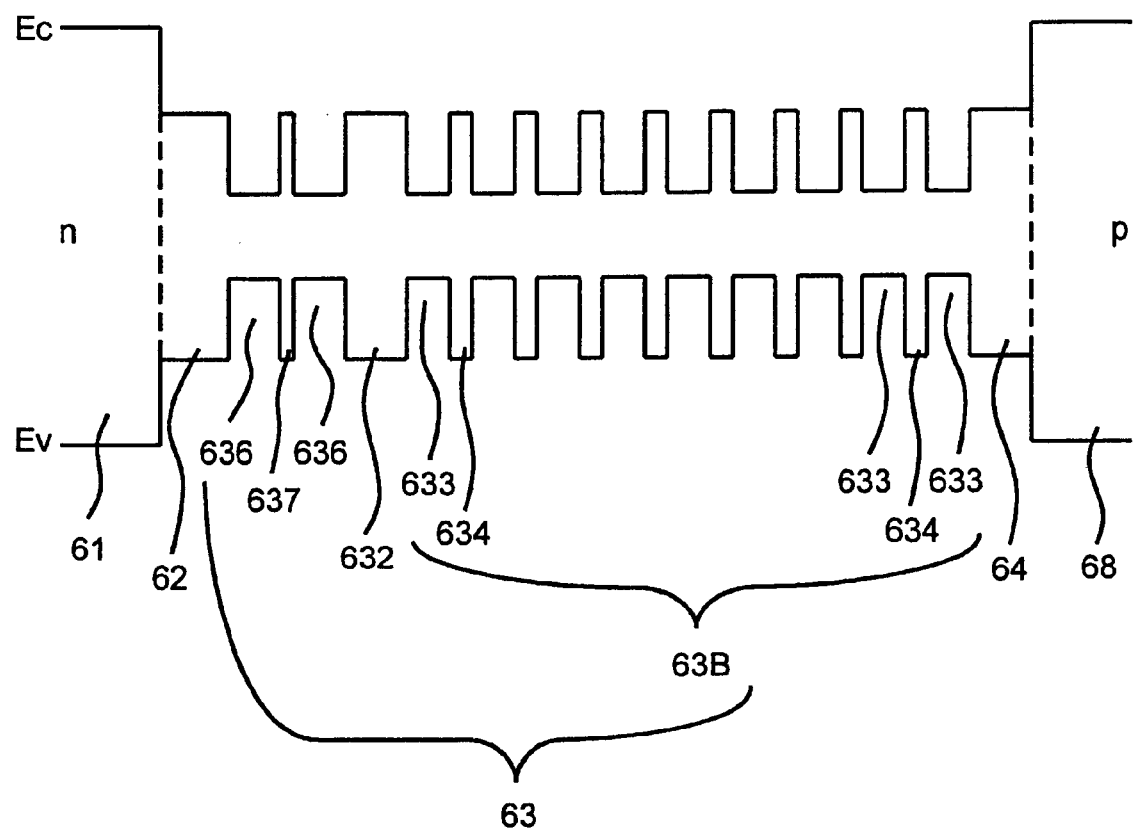
FIG. 20 is a schematic representation showing the energy band of the multiple quantum well structure shown in FIG. 19.

FIG. 19 is a cross-sectional view showing the multiple quantum well structure of the light absorption layer 63 according to the third embodiment. FIG. 20 is a schematic representation showing the energy band of the multiple quantum well structure shown in FIG. 19.

In FIG. 19, reference numeral 636 designates a pair of 'C' well layers which are identical in thickness with the 'B' well layer 633, formed from the same InGaAsP as that used for composing the 'B' well layer 633, and which are to act as a first well layer. Reference numeral 637 designates a 'C' barrier layer which is sandwiched between the paired 'C' well layers 636 and is formed from the same InGaAsP as that used for composing the 'B' well layer 634 so as to become sufficiently thinner than the 'B' barrier layer 634. In other respects, the optical modulator 50 according to the third embodiment is identical in structure with that employed in the first embodiment.

Figure 21A:
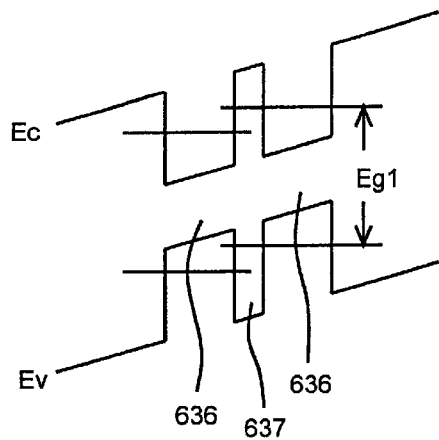
FIGS. 21A and 21B are schematic representations showing the energy band of the paired 'C' well layers in the third embodiment.
Figure 21B:
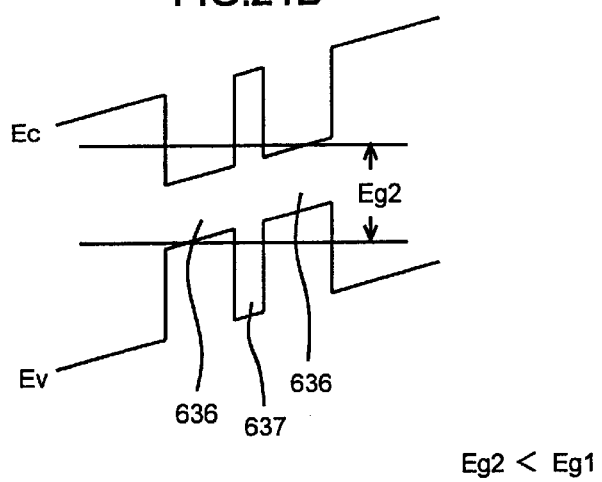

FIGS. 21A and 21B are schematic representations showing the energy band of the paired 'C' well layers 636.

When a small bias voltage is applied to the optical modulator 50, the paired 'C' well layers 636 in the optical modulator 50 act as independent well layers, as shown in FIG. 21A. Each of the 'C' well layers 636 forms a quantum energy level, and the effective band-gap of the 'C' well layer 636 at that time is expressed as Eg1. As the bias voltage increases, the energy band is changed by means of an electric field, as shown in FIG. 21B. The effective thickness of the 'C' barrier layer 637 interposed between the paired 'C' well layers 636 is reduced, wherewith carriers behave as if a single thick well layer is present. For this reason, the effective band-gap becomes Eg2, which is smaller than Eg1.

Figure 22:
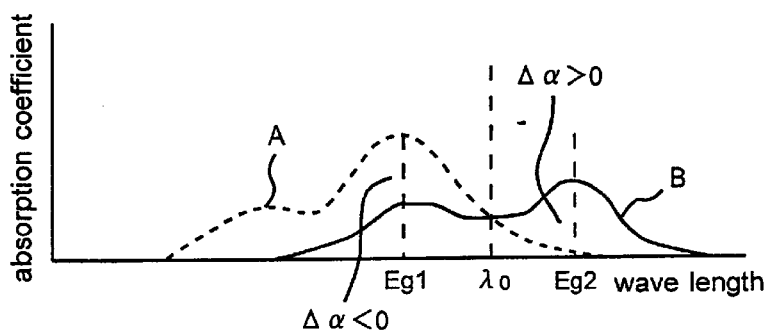
FIG. 22 is a graph showing variation in the absorption spectrum of the paired well layers in the third embodiment.

FIG. 22 is a graph showing variation in the absorption spectrum of the paired well layers 636 when an applied voltage is applied to the paired well layers 636. In FIG. 22, the absorption spectrum 'A' is denoted by broken line and corresponds to an absorption spectrum appearing when no voltage is applied to the paired well layers 636. In a case where an electric field is applied to the paired well layers 636, the absorption spectrum 'A' turns into an absorption spectrum 'B' denoted by a solid line. Here, $\lambda_0$ denotes the wavelength of incident light.

Variation $\Delta\alpha$ in absorption coefficient changes in the vicinity of the wavelength $\lambda_0$ of incident light from $\Delta\alpha<0$ to $\Delta\alpha>0$. Such variation in absorption spectrum is identical with that arising in the first embodiment shown in FIG. 10. When the amount of variation in the refractive index of each of the paired 'C' well layers 636 is calculated, the computation result is the same as that obtained from the curve of '1 well' of the first embodiment shown in FIG. 13. Accordingly, the third embodiment can yield the same advantage as that yielded by the first embodiment.

In the first through third embodiments, the 'A' well layer 631, the 'A' well layer 635, the 'A' well layer 635A, and the paired 'C' well layers 636 are positioned closest to the n-type optical confinement layer 62. However, advantages which are the same as those yielded by the first through third embodiments can be yielded even when the 'A' well layer or the paired 'C' well layers are disposed at an arbitrary position.

Although an n-type substrate is used as a substrate of an optical modulator, the same advantages as those yielded in the previous embodiments can be yielded even when an optical modulator is formed from a p-type substrate.

Fourth Embodiment

In the fourth embodiment of the present invention, the optical modulator as described in any one of the first through third embodiments is formed on the same substrate as that used for forming a semiconductor laser, to thereby constitute a semiconductor laser device equipped with an optical modulator.

Figure 23:
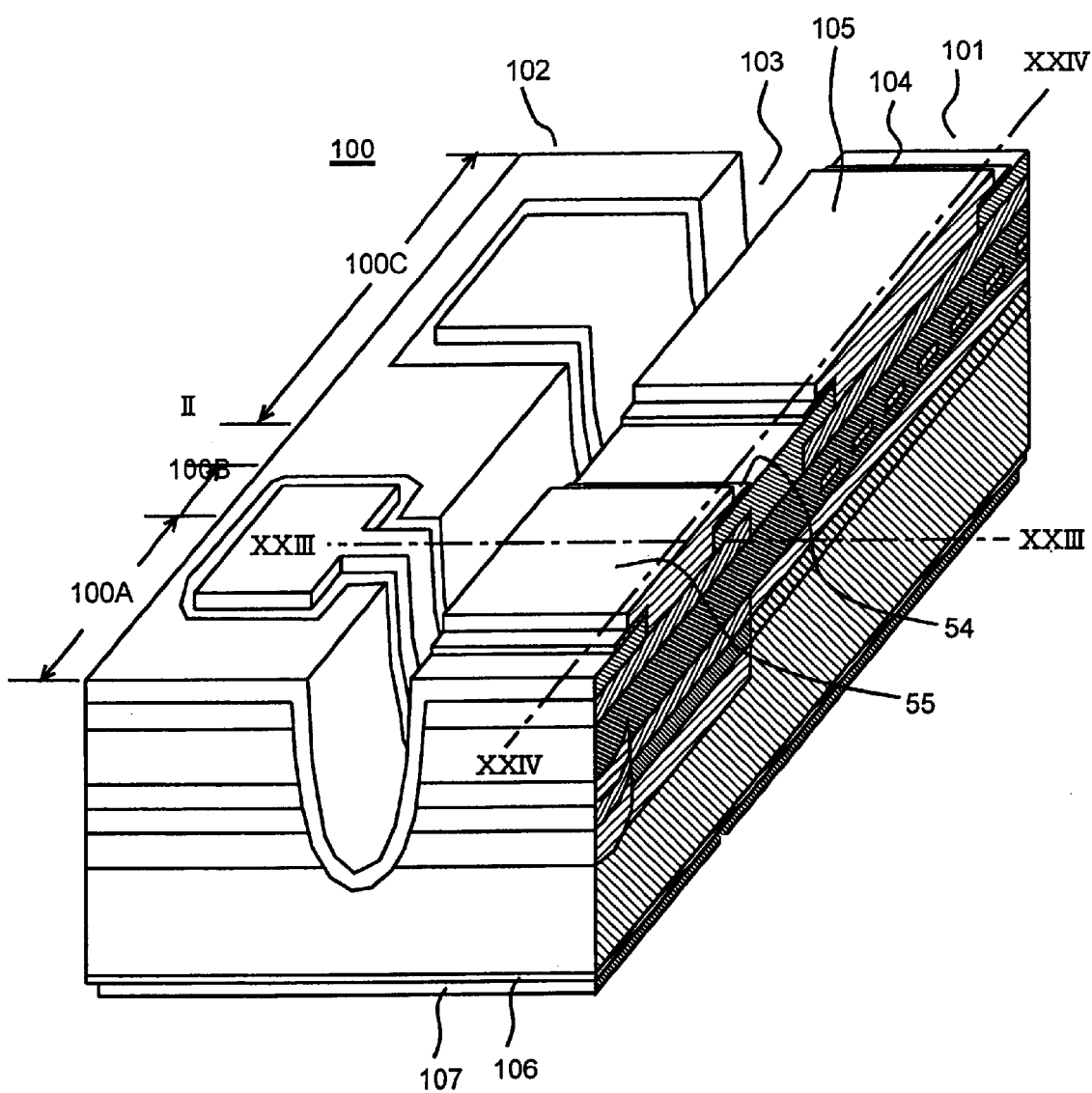
FIG. 23 is a perspective cross-sectional view showing a semiconductor laser device equipped with an optical modulator according to a fourth embodiment of the present invention.
Figure 24:
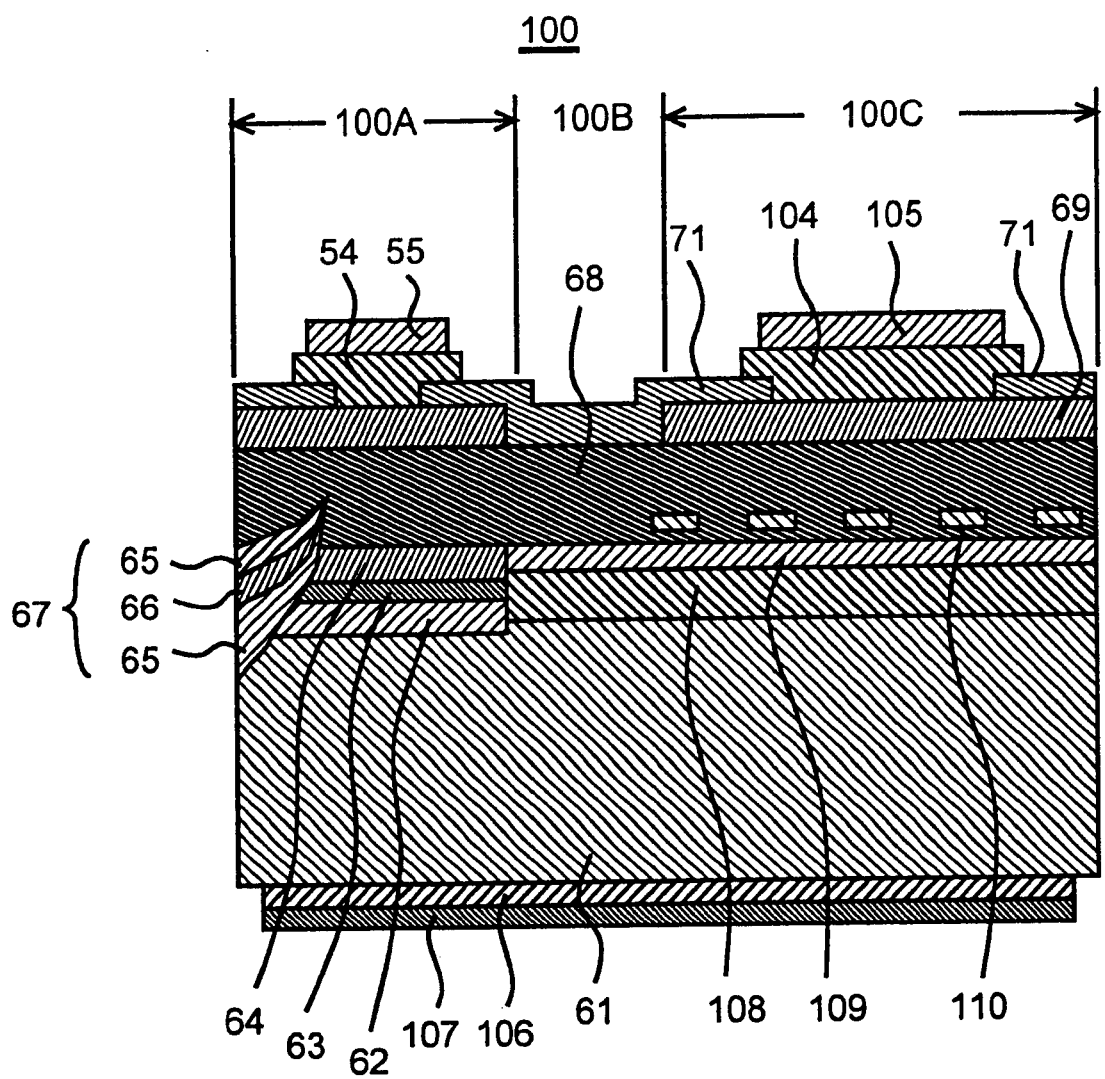
FIG. 24 is a cross-sectional view of a semiconductor laser device with an optical modulator taken along line XXIV—XXIV shown in FIG. 23.

FIG. 23 is a perspective cross-sectional view showing a semiconductor laser device equipped with an optical modulator according to the fourth embodiment. FIG. 24 is a cross-sectional view of a semiconductor laser device with an optical modulator taken along line XXIV—XXIV shown in FIG. 23.

In FIG. 23, reference numeral 100 designates a semiconductor laser device equipped with an optical modulator; 100A designates an optical modulator; 100B designates an isolation section; and 100C designates a semiconductor laser section.

Reference numeral 101 designates an optical modulator/semiconductor laser mesa portion; 102 designates an electrode pad; 103 designates an isolation trench for isolating the optical modulator/semiconductor laser mesa portion 101 and the electrode pad 102; 104 designates a semiconductor laser surface electrode; 105 designates a surface plating layer provided on the semiconductor laser surface electrode 104; 106 designates an underside electrode provided on the underside of the substrate 61; and 107 designates an underside plating layer provided on the reverse side electrode 106.

In FIG. 24, reference numeral 108 designates an active layer formed from InGaAsP. The active layer 108 may be formed so as to have a bulk structure or an MQW structure which is the same as that employed in the light absorption layer 63 of the optical modulator 100A. Reference numeral 109 designates an InP guide layer, and 110 designates a diffraction grating formed from InGaAsP.

In the semiconductor laser device 100 equipped with an optical modulator, the active layer 108 of the semiconductor laser section 100C and the light absorption layer 63 of the optical modulator section 100A are positioned in line with a single optical axis. The semiconductor laser section 100C and the optical modulator 100A are integrated on the single n-InP substrate 61 with the isolation section 100B interposed therebetween.

The optical modulator section 100A represented by the cross-sectional view taken along line XXIII—XXIII shown in FIG. 24 is identical in structure with the optical modulator shown in FIG. 2. In FIGS. 23 and 24, those reference numerals which are the same as those shown in FIGS. 1 through 3 designate identical or corresponding elements.

The semiconductor laser device 100 equipped with an optical modulator is substantially formed as follows:

On the n-InP substrate 61 there are formed, in the sequence given and by means of the MOCVD technique, the InGaAsP active layer 108, the InP guide layer 109, and an InGaAsP layer which is to act as the InGaAsP diffraction grating 110.

Subsequently, a SiO$_2$ dielectric film is formed, and the SiO$_2$ dielectric film is etched into a grating pattern by means of the interference exposure technique or the EB lithography exposure technique. The InGaAsP layer which is to act as the diffraction grating 110 is etched while the thus-etched SiO$_2$ dielectric film is used as an etching mask, to thereby form the diffraction grating 110. Further, the etching mask used for etching the diffraction grating 110 is removed, and the p-type cladding layer 68 is formed on the wafer from p-InGaAsP.

A mask is formed from SiO$_2$ dielectric film, and the portion of the wafer where the optical modulator section 100A is to be formed is etched until the n-InP substrate 61 becomes uncovered.

While the mask of SiO$_2$ dielectric film used for the etching operation is taken as a selective growth mask, the n-InGaAsP n-type optical confinement layer 62, the InGaAsP-MQW light absorption layer 63, the p-InGaAsP p-type optical confinement layer 64, and the p-InGaAsP p-type cladding layer 68 are stacked, in the sequence given, on the etched portion of the substrate 61 at which the optical modulator section 100A is to be formed, by means of the MOCVD technique.

After removal of the SiO$_2$ dielectric film used for selective growth, another dielectric film is formed, to thereby align the active layer 108 of the semiconductor laser section 100C and the light absorption layer 63 of the optical modulator section 100A with a single optical axis. Thus, a stripe-shaped dielectric film is formed, and a wave-guide ridge is formed while the dielectric film is used as a mask.

While the stripe-shaped dielectric film is used as a mask, the Fe-doped InP embedded layer 65, the n-InP embedded layer 66, and the Fe-doped InP embedded layer 65 are formed on either side of the wave-guide ridge.

Subsequently, the wave-guide ridge, the Fe-doped InP embedded layer 65, the n-InP embedded layer 66, the p-InGaAsP p-type cladding layer 68, and the p-InGaAs contact layer 69 are subjected to crystal growth. The isolation section 100B for isolating the optical modulator section 100A from the semiconductor laser section 100C is formed by means of etching the contact layer 69. Subsequent steps are the same as those employed in the first embodiment.

In the steps that follow, the light absorption layer 63 of the optical modulator section 100A is formed into the same structure as that described in connection with the first through third embodiments.

In the semiconductor laser device equipped with an optical modulator having the foregoing configuration, the optical modulator section 100A yields the same advantages as those yielded by the optical modulators 50 described in connection with the first through third embodiments. Therefore, even within the range in which a small voltage is applied to the optical modulator section 100A, the amount of variation in the refractive index of the overall MQW structure of the optical modulator section 100A can be diminished.

By extension, there can be formed a semiconductor laser device equipped with an optical modulator which suppresses occurrence of a chirping phenomenon while deterioration of an extinction ratio and light loss are reduced, and hence a semiconductor laser device equipped with an optical modulator which is inexpensive and has superior light transmission performance can be obtained.

Fifth Embodiment

In the fifth embodiment of the present invention, an optical transmitter is equipped with the optical modulator according to any one of the first through third embodiments or the semiconductor laser device equipped with an optical modulator according to the fifth embodiment, to thereby constitute an optical communications system.

Figure 25:
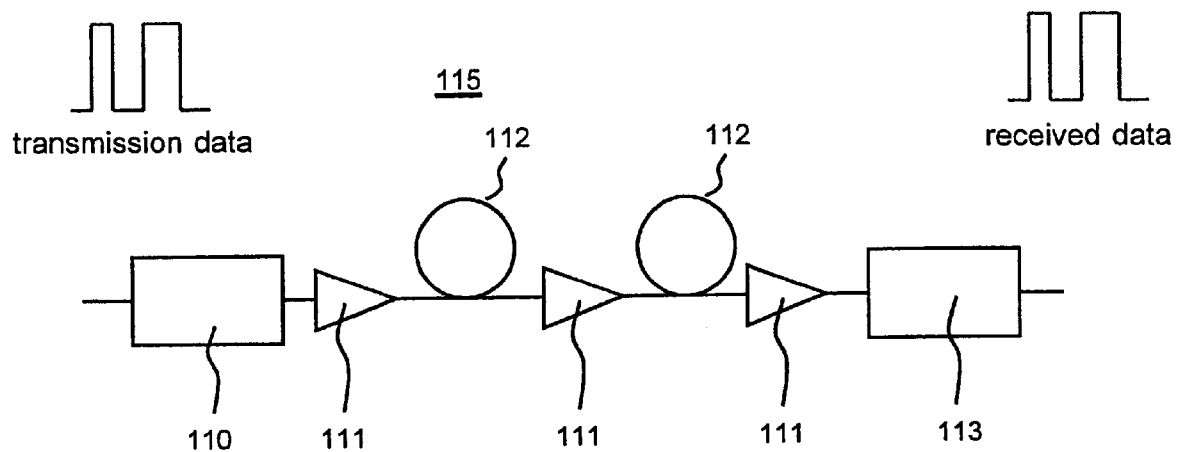
FIG. 25 is a block diagram showing an optical communication system using the optical modulator or the semiconductor laser device equipped with an optical modulator according to a fifth embodiment of the present invention.
Figure 26:
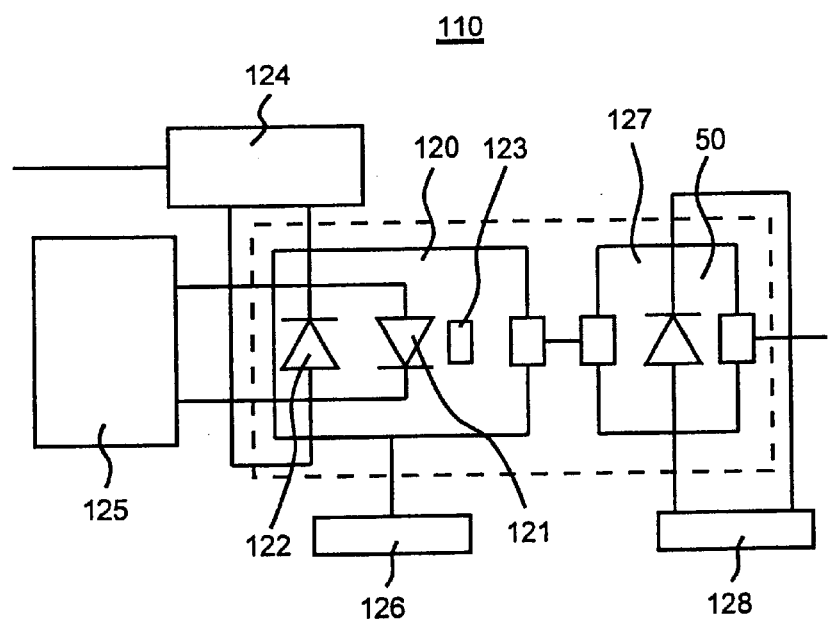
FIG. 26 is a block diagram showing an optical transmitter used with the optical communication system shown in FIG. 25.
Figure 27:
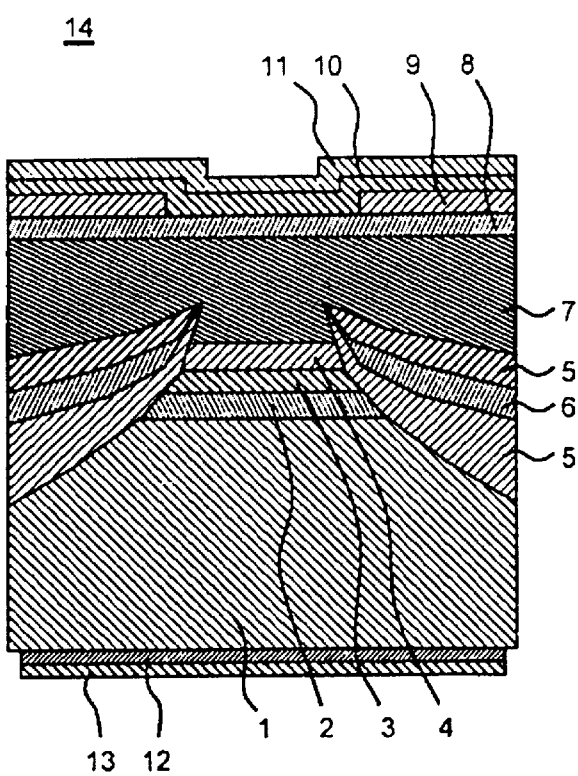
FIG. 27 is a cross-sectional view showing a conventional optical modulator.

FIG. 25 is a block diagram showing an optical communication system using the optical modulator or the semiconductor laser device equipped with an optical modulator according to the present invention. FIG. 26 is a block diagram showing the optical transmitter which is to be used with the optical communication system shown in FIG. 25 and which uses the optical modulator or the semiconductor laser device equipped with an optical modulator according to the present invention.

As shown in FIG. 25, transmission data transmitted from the optical transmitter 110 are sent to an optical receiver 113, as received data, by way of optical amplifiers 111 and optical fibers 112 provided at intermediate positions between the optical transmitter 110 and the optical receiver 113. Reference numeral 115 designates an optical communication system formed from these devices.

In FIG. 26, reference numeral 120 designates an LD module, and the LD module 120 comprises a semiconductor laser diode (LD) 121 for producing a laser beam; a photodiode (PD) 122 for detecting underside output light; and an optical isolator 123. The photodiode 122 detects underside output light, and output light is made uniform by means of a drive current being controlled by an LD drive circuit 125 with the assistance of an underside output light detection circuit and an output control circuit 124. The temperature of the LD module 120 is made uniform by means of a temperature control circuit 126.

Reference numeral 127 designates an optical modulator module having the optical modulator 50 of the present invention stored therein. The optical modulator 50 modulates light through use of a pulse signal generation circuit 128, thus forming the optical waveform of transmission data.

The portion of a semiconductor LD 121 and the optical modulator 50 encircled by a dotted line shown in FIG. 26 can be replaced with the semiconductor laser device 100 equipped with an optical modulator according to the fourth embodiment.

As mentioned above, the optical transmitter 110, equipped with the optical modulator according to any one of the first through third embodiments or the semiconductor laser device according to the fourth embodiment which in turn equipped with an optical modulator, can reduce a chirping phenomenon without involvement of deterioration of an extinction ratio or light loss. In the optical communications system 115 equipped with the optical transmitter 110, a long transmission distance can be ensured, wherewith a highly-reliable and inexpensive optical communications system can be constructed.

In summary, the optical modulator, the semiconductor laser device equipped with an optical modulator, and the optical communication system according to the present invention are embodied as mentioned previously and yield the following advantages.

In one aspect, in the optical modulator according to the present invention, a light absorption layer has a multiple quantum well structure comprising a first well layer and a plurality of second well layers, the peak wavelength of the absorption spectrum of the second well layer being shorter than the peak wavelength of the absorption spectrum of the first well layer. Therefore, variation in absorption coefficient, which would otherwise be induced by application of a voltage to the light absorption layer, is reversed from positive to negative in the vicinity of the wavelength of incident light. Variation in the refractive index of the first well layer can be reversed to negative variation, and positive variation in refractive index of the overall light absorption layer can be diminished, thus forming an optical modulator with a less severe chirping phenomenon.

In another aspect, the barrier layer interposed between the first well layer and the second well layer is formed so as to become thicker than a barrier layer interposed between the second well layers, to thereby prevent a decrease in oscillator strength, which would otherwise be induced by binding between the first well layer and the second well layer. Even in a case where an electric field is applied to a well layer, the height of the peak of the absorption spectrum of the first well layer can be maintained, thereby effectively reducing the severity of a chirping phenomenon.

In another aspect, the optical modulator as described in any one of the previous embodiments and a semiconductor laser device may be formed on a single semiconductor substrate, whereby the present invention can realize a compact semiconductor laser device equipped with an optical modulator which suppresses a chirping phenomenon.

In another aspect, The optical modulator as described in any one of the previous embodiments and the semiconductor laser device equipped with an optical modulator may be provided in an optical communication system, thereby realizing an inexpensive optical communication system which suppresses a chirping phenomenon and provides a long transmission distance.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 12-092860, filed on Mar. 30, 2000 including specification, claims, drawings and summary, on which the Convention priority of the present application is based, are incorporated herein by reference in its entirety.

What is claimed is:

1. An optical modulator comprising:
    a semiconductor substrate of a first conductivity type and having a band-gap wavelength;
    a first light confinement layer of the first conductivity type, on the semiconductor substrate, and having a band-gap wavelength longer than that of the semiconductor substrate;
    a light absorption layer on the first light confinement layer and having a multiple quantum well structure, the multiple quantum well structure comprising a first well layer and a plurality of second well layers, the first and second well layers having respective absorption spectra with respective peak wavelengths, the peak wavelength of the absorption spectrum of the second well layers being shorter than the peak wavelength of the absorption spectrum of the first well layer;
    a second light confinement layer of a second conductivity type, having a band-gap wavelength, and disposed on the light absorption layer; and
    a semiconductor cladding layer of the second conductivity type on the light absorption layer and having a band-gap wavelength shorter than that of the second light confinement layer.

2. The optical modulator according to claim 1, wherein the first well layer has an absorption spectrum with a longer peak wavelength than the peak wavelength of the second well layers.

3. The optical modulator according to claim 1, wherein the first well layer is thicker than the second well layers.

4. The optical modulator according to claim 1, wherein the first well layer has a band-gap wavelength longer than a band-gap wavelength of the second well layers.

5. The optical modulator according to claim 1, wherein the peak wavelength of the absorption spectrum of the first well layer is longer than the peak wavelength of the absorption spectrum of the second well layers by at least 10 nm.

6. The optical modulator according to claim 1, including a first barrier layer interposed between the first well layer and one of the second well layers, and a second barrier layer sandwiched between a pair of the second well layers and thinner than the first barrier layer.

7. An optical communications system comprising an optical modulator according to claim 1.

8. A semiconductor laser device comprising a semiconductor laser and an optical modulator according to claim 1 on a common semiconductor substrate.

9. An optical communications system comprising a semiconductor laser device including an optical modulator according to claim 8.

10. An optical modulator comprising:
   a semiconductor substrate of a first conductivity type;
   a light absorption layer on the semiconductor substrate and having a multiple quantum well structure, the multiple quantum well structure comprising
      a plurality of first well layers,
      barrier layers sandwiched between the first well layers and having a thickness at which carriers bind together between the first well layers in response to an electric field corresponding to an extinction voltage, and
      a plurality of second well layers, the first and second well layers having respective absorption spectra with respective peak wavelengths, the peak wavelength of the absorption spectrum of the second well layers being shorter than the peak wavelength of the absorption spectrum of the first well layers; and
   a semiconductor cladding layer of a second conductivity type on the light absorption layer.

11. An optical modulator comprising:
   a semiconductor substrate of a first conductivity type;
   a light absorption layer on the semiconductor substrate and having a multiple quantum well structure, the multiple quantum well structure comprising
      a first well layer,
      a plurality of second well layers,
      a first barrier layer interposed between the first well layer and one of the second well layers, the first and second well layers having respective absorption spectra with respective peak wavelengths, the peak wavelength of the absorption spectrum of the second well layers being shorter than the peak wavelength of the absorption spectrum of the first well layer, and
      second barrier layers having a band-gap wavelength, wherein the first barrier layer has a width thicker than the second barrier layers, the second barrier layers are sandwiched between pairs of the second well layers, and the first barrier layer has a band-gap wavelength no longer than the band-gap wavelength of the second barrier layers; and
   a semiconductor cladding layer of a second conductivity type on the light absorption layer.

12. The optical modulator according to claim 11, wherein the first barrier layer has the same band-gap wavelength as the second barrier layers.

* * * * *